(12) United States Patent
Lin

(10) Patent No.: US 9,460,951 B2
(45) Date of Patent: Oct. 4, 2016

(54) SEMICONDUCTOR DEVICE AND METHOD OF WAFER LEVEL PACKAGE INTEGRATION

(75) Inventor: Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 407 days.

(21) Appl. No.: 13/172,680

(22) Filed: Jun. 29, 2011

(65) Prior Publication Data

US 2011/0254156 A1 Oct. 20, 2011

Related U.S. Application Data

(63) Continuation-in-part of application No. 11/949,282, filed on Dec. 3, 2007.

(51) Int. Cl.
*H01L 21/44* (2006.01)
*H01L 21/683* (2006.01)
(Continued)

(52) U.S. Cl.
CPC ......... *H01L 21/6835* (2013.01); *H01L 21/566* (2013.01); *H01L 23/3128* (2013.01); *H01L 23/3135* (2013.01); *H01L 23/5389* (2013.01); *H01L 24/81* (2013.01); *H01L 23/49816* (2013.01); *H01L 23/49822* (2013.01);
(Continued)

(58) Field of Classification Search
CPC ........... H01L 21/6853; H01L 21/4857; H01L 23/5389; H01L 23/3121; H01L 23/5385; H01L 23/49822
USPC .......... 257/E23.02, 778, 723, 698, 701, 703, 257/724; 438/108, 613, 623, 631
See application file for complete search history.

(56) References Cited

U.S. PATENT DOCUMENTS 5,239,448 A 8/1993 Perkins et al.
5,250,843 A 10/1993 Eichelberger
(Continued)

FOREIGN PATENT DOCUMENTS

| KR | 20030075814 A | 9/2003 |
|---|---|---|
| TW | 200527625 A | 8/2005 |
| WO | 2005/008724 A2 | 1/2005 |

OTHER PUBLICATIONS

Hazeyama ("Micro-Bump Formation Technology for Flip-Chip LSIs Using Micro-Solder-Ball", NEC Res. & Develop., vol. 44, No. 3, Jul. 2003).*

*Primary Examiner* — Trung Q Dang
(74) *Attorney, Agent, or Firm* — Robert D. Atkins; Patent Law Group: Atkins and Associates, P.C.

(57) ABSTRACT

A method of making a wafer level chip scale package includes providing a temporary substrate, and forming a wafer level interconnect structure over the temporary substrate using wafer level processes. The wafer level processes include forming a first insulating layer in contact with an upper surface of the temporary substrate, and forming a first conductive layer in contact with an upper surface of the first passivation layer. A first semiconductor die is mounted over the wafer level interconnect structure such that an active surface of the first semiconductor die is in electrical contact with the first conductive layer, and a first encapsulant is deposited over the first semiconductor die. A second encapsulant is deposited over the first encapsulant, and the first and second encapsulants are cured simultaneously. The temporary substrate is removed to expose the first passivation layer.

26 Claims, 14 Drawing Sheets

(51) Int. Cl.
*H01L 21/56* (2006.01)
*H01L 23/31* (2006.01)
*H01L 23/538* (2006.01)
*H01L 23/00* (2006.01)
*H01L 23/498* (2006.01)

(52) U.S. Cl.
CPC ............... *H01L24/48* (2013.01); *H01L 24/73* (2013.01); *H01L 2221/68345* (2013.01); *H01L 2224/16145* (2013.01); *H01L 2224/16237* (2013.01); *H01L 2224/32225* (2013.01); *H01L 2224/48091* (2013.01); *H01L 2224/48227* (2013.01); *H01L 2224/48228* (2013.01); *H01L 2224/73204* (2013.01); *H01L 2224/73265* (2013.01); *H01L 2224/81005* (2013.01); *H01L 2224/81191* (2013.01); *H01L 2224/81815* (2013.01); *H01L 2924/01004* (2013.01); *H01L 2924/014* (2013.01); *H01L 2924/0105* (2013.01); *H01L 2924/01006* (2013.01); *H01L 2924/01013* (2013.01); *H01L 2924/01023* (2013.01); *H01L 2924/01024* (2013.01); *H01L 2924/01029* (2013.01); *H01L 2924/01033* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/04941* (2013.01); *H01L 2924/10253* (2013.01); *H01L 2924/10329* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/1532* (2013.01); *H01L 2924/15192* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/30105* (2013.01)

(56) References Cited

U.S. PATENT DOCUMENTS

| | | | |
|---|---|---|---|
| 5,321,210 A | 6/1994 | Kimbara et al. | |
| 5,353,498 A | 10/1994 | Fillion et al. | |
| 5,710,071 A * | 1/1998 | Beddingfield et al. | 438/108 |
| 5,841,193 A | 11/1998 | Eichelberger | |
| 5,998,243 A * | 12/1999 | Odashima et al. | 438/127 |
| 6,046,077 A | 4/2000 | Baba | |
| 6,075,290 A * | 6/2000 | Schaefer et al. | 257/737 |
| 6,291,331 B1 | 9/2001 | Wang et al. | |
| 6,312,830 B1 | 11/2001 | Li et al. | |
| 6,319,846 B1 * | 11/2001 | Lin et al. | 438/754 |
| 6,396,153 B2 | 5/2002 | Fillion et al. | |
| 6,418,615 B1 * | 7/2002 | Rokugawa et al. | 29/852 |
| 6,459,159 B1 * | 10/2002 | Miyagawa et al. | 257/778 |
| 6,518,089 B2 * | 2/2003 | Coyle | 438/106 |
| 6,662,442 B1 | 12/2003 | Matsui et al. | |
| 6,838,776 B2 | 1/2005 | Leal et al. | |
| 6,919,226 B2 | 7/2005 | Ogawa et al. | |
| 6,921,975 B2 | 7/2005 | Leal et al. | |
| 7,019,404 B2 * | 3/2006 | Rokugawa et al. | 257/778 |
| 7,041,590 B2 * | 5/2006 | Tseng et al. | 438/613 |
| 7,125,745 B2 | 10/2006 | Chen et al. | |
| 7,268,012 B2 | 9/2007 | Jiang et al. | |
| 7,351,784 B2 * | 4/2008 | Lehman, Jr. | 528/122 |
| 7,619,901 B2 | 11/2009 | Eichelberger et al. | |
| 2002/0068453 A1 * | 6/2002 | Grigg et al. | 438/690 |
| 2003/0054184 A1 * | 3/2003 | Miyadera et al. | 428/473.5 |
| 2003/0157799 A1 * | 8/2003 | Ding et al. | 438/687 |
| 2003/0160325 A1 | 8/2003 | Yoneda et al. | |
| 2003/0183917 A1 | 10/2003 | Tsai et al. | |
| 2003/0188975 A1 * | 10/2003 | Nielsen | H01L 21/2885 205/292 |
| 2003/0193088 A1 * | 10/2003 | Hall et al. | 257/713 |
| 2004/0040152 A1 | 3/2004 | Kigami et al. | |
| 2004/0056344 A1 * | 3/2004 | Ogawa et al. | 257/686 |
| 2004/0124513 A1 | 7/2004 | Ho et al. | |
| 2005/0006752 A1 | 1/2005 | Ogawa | |
| 2005/0136761 A1 * | 6/2005 | Murakami et al. | 442/59 |
| 2005/0194674 A1 | 9/2005 | Thomas et al. | |
| 2005/0212133 A1 | 9/2005 | Barnak et al. | 257/738 |
| 2005/0224966 A1 * | 10/2005 | Fogel et al. | 257/737 |
| 2005/0287706 A1 | 12/2005 | Fuller et al. | |
| 2006/0103029 A1 * | 5/2006 | Basheer et al. | 257/778 |
| 2006/0121719 A1 | 6/2006 | Nakamura et al. | |
| 2006/0134831 A1 | 6/2006 | Cohen et al. | |
| 2006/0255438 A1 * | 11/2006 | Omori et al. | 257/670 |
| 2006/0255473 A1 * | 11/2006 | Pendse | 257/778 |
| 2006/0272854 A1 * | 12/2006 | Yamano | 174/264 |
| 2007/0001293 A1 | 1/2007 | Jiang et al. | |
| 2007/0076348 A1 * | 4/2007 | Shioga et al. | 361/307 |
| 2009/0046441 A1 * | 2/2009 | Funaya et al. | 361/783 |

* cited by examiner

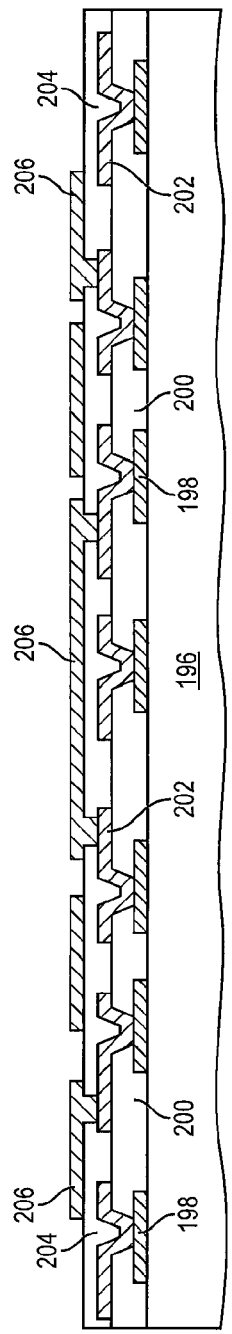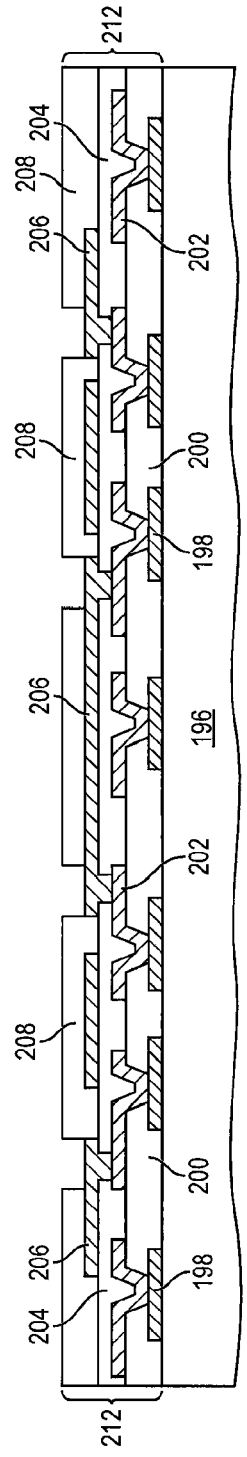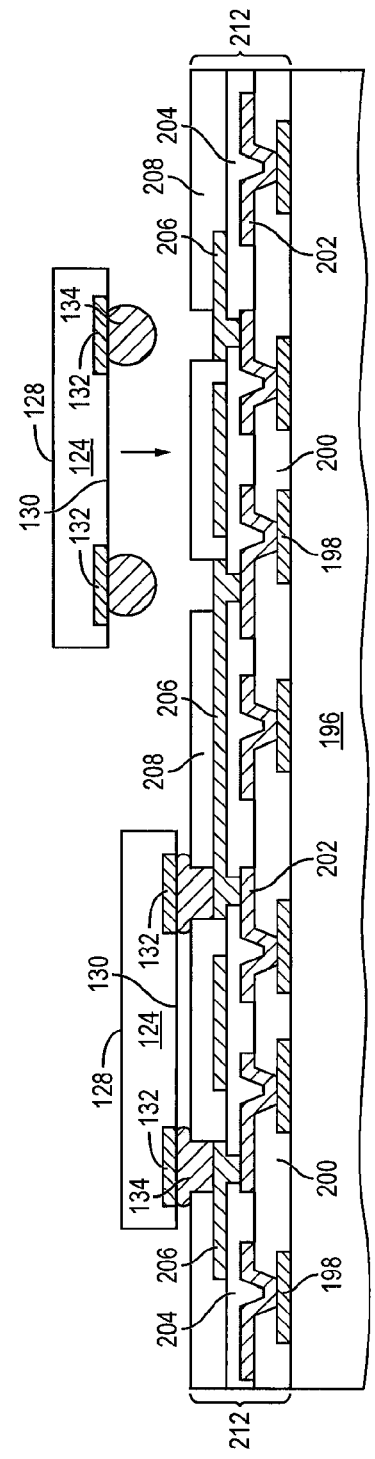
FIG. 6c
FIG. 6d
FIG. 6e

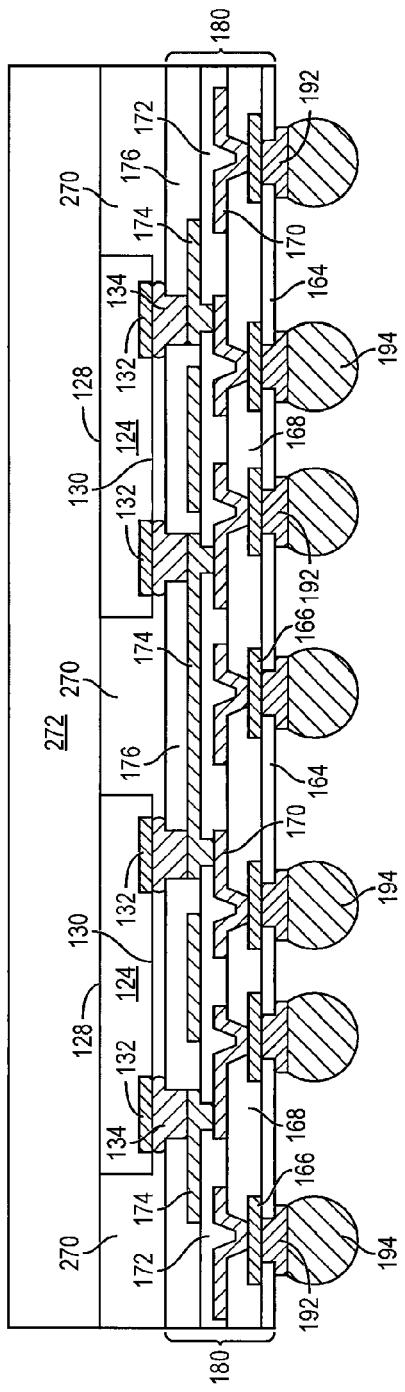
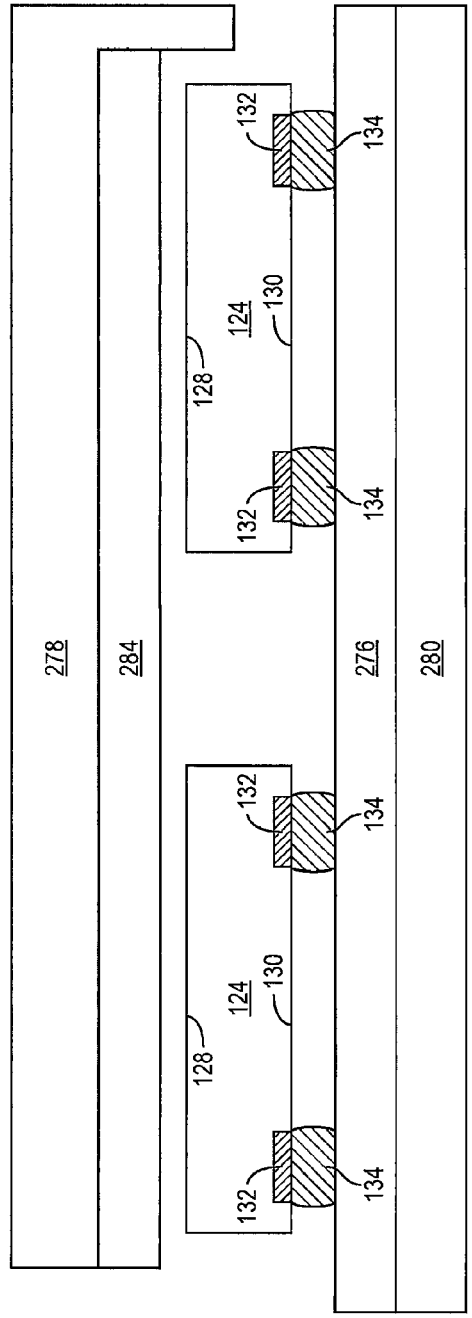
FIG. 11
FIG. 12a

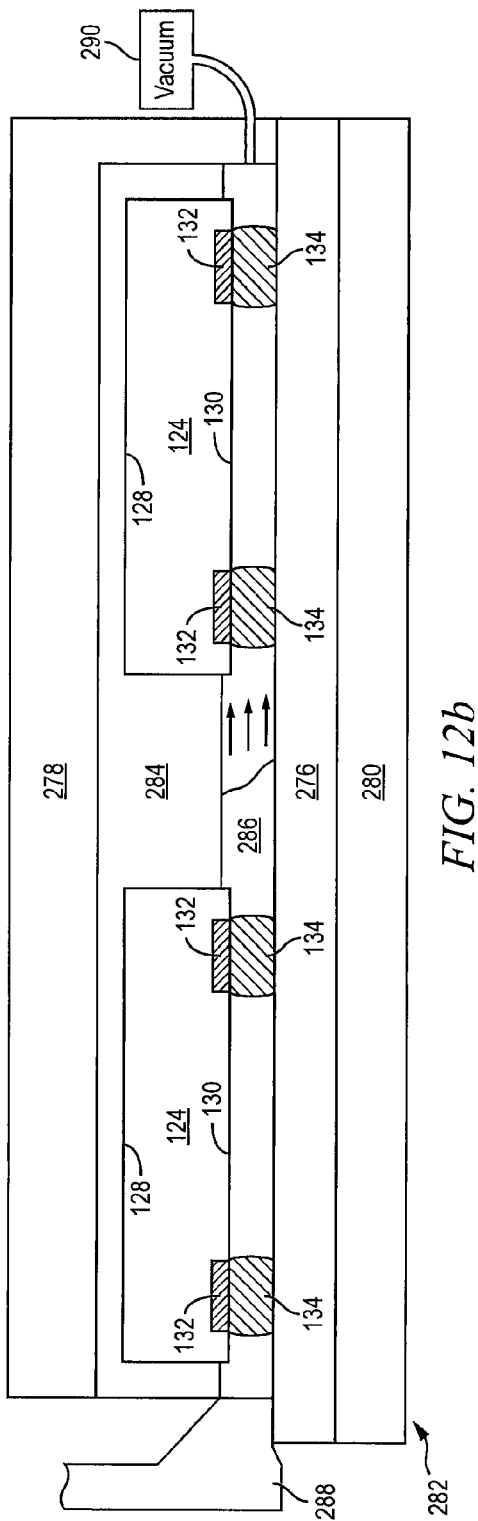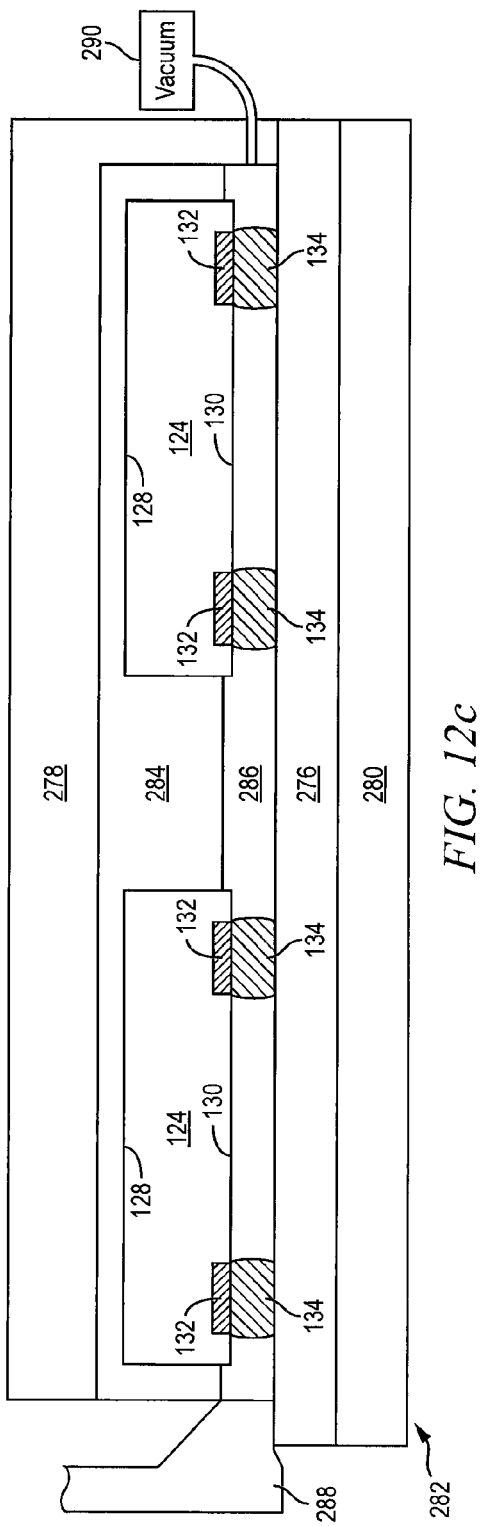

SEMICONDUCTOR DEVICE AND METHOD OF WAFER LEVEL PACKAGE INTEGRATION

CLAIM TO DOMESTIC PRIORITY

The present application is a continuation-in-part of U.S. patent application Ser. No. 11/949,282, filed Dec. 3, 2007, and claims priority to this application pursuant to 35 U.S.C. §120.

FIELD OF THE INVENTION

The present invention relates in general to semiconductor devices and, more particularly, to a semiconductor device and method of wafer level (WL) package integration.

BACKGROUND OF THE INVENTION

Semiconductor devices are commonly found in modern electronic products. Semiconductor devices vary in a number and a density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly, can refer to both a single semiconductor device and multiple semiconductor devices. Back-end manufacturing involves singulating individual die from the finished wafer and packaging the die to provide structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSPs) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through an interconnect structure comprising a large number of conductive bumps or balls. The bumps may be formed by a reflow process applied to solder material deposited on contact pads which are disposed on the semiconductor substrate. The bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to achieve WL package integration with one or more semiconductor devices. The interconnect between the semiconductor die has been achieved with through hole conductive vias and redistribution layers (RDLs). However, the formation of the interconnect structure, including RDLs, is typically performed on an organic substrate having a low glass transition temperature (Tg). The substrate's Tg is typically less than 200° C., which limits processing options for the interconnect structure. In addition, the inter-wafer and intra-wafer registration variation of the semiconductor wafer is relatively large, which reduces manufacturability and wafer integration.

SUMMARY OF THE INVENTION

In one embodiment, the present invention is a method of making a wafer level chip scale package comprising providing a temporary substrate, and forming a wafer level interconnect structure over the temporary substrate using wafer level processes. The wafer level processes include forming a first insulating layer in contact with an upper surface of the temporary substrate, and forming a first conductive layer in contact with an upper surface of the first passivation layer. A first semiconductor die is mounted over the wafer level interconnect structure such that an active surface of the first semiconductor die is in electrical contact with the first conductive layer, and a first encapsulant is deposited over the first semiconductor die. A second encapsulant is deposited over the first encapsulant, and the first and second encapsulants are cured simultaneously. The temporary substrate is removed to expose the first passivation layer, an under bump metallization (UBM) is formed in electrical contact with the first conductive layer, and conductive bumps are formed on the UBM.

In another embodiment, the present invention is a method of making a wafer level chip scale package comprising providing a temporary wafer level substrate, and forming a wafer level interconnect structure over the temporary wafer level substrate using wafer level processes. The wafer level processes include forming a first insulating layer on a top surface of the temporary wafer level substrate, and forming a first conductive layer over the first insulating layer. The method further comprises mounting a first semiconductor die over the wafer level interconnect structure in electrical contact with the first conductive layer, and depositing a first encapsulant around the first semiconductor die. The temporary wafer level substrate is removed to expose a bottom surface of the first insulating layer, and an interconnect structure is formed in electrical contact with the first conductive layer.

In another embodiment, the present invention is a method of making a wafer level chip scale package comprising providing a temporary wafer level substrate, and forming a wafer level interconnect structure over the temporary wafer level substrate using wafer level processes. The wafer level processes include forming a first insulating layer on a top surface of the temporary wafer level substrate, and forming a first conductive layer over the first insulating layer. The method further comprises mounting a first semiconductor die over the wafer level interconnect structure in electrical contact with the first conductive layer, and depositing a first encapsulant around the first semiconductor die.

In another embodiment, the present invention is a semiconductor device comprising a temporary wafer level substrate, and a wafer level interconnect structure disposed over the temporary wafer level substrate. The wafer level interconnect structure includes a first insulating layer disposed over a top surface of the temporary wafer level substrate, and a first conductive layer disposed over the first insulating layer. The semiconductor device further comprises a first semiconductor die disposed over the wafer level interconnect structure and in electrical contact with the first conductive layer, and a first encapsulant disposed around the first semiconductor die.

BRIEF DESCRIPTION OF THE DRAWINGS

FIGS. 6a-6g illustrate formation of an interconnect structure for semiconductor die using a RDL in accordance with another embodiment;

FIG. 11 illustrates an alternative embodiment of an interconnect structure for the semiconductor die with first and second encapsulants;

FIGS. 12a-12d are illustrative of mold underfill (MUF) processes that are useful for depositing encapsulant around semiconductor die and in a gap between a semiconductor die and an underlying substrate after semiconductor die are mounted to the underlying substrate.

DETAILED DESCRIPTION OF THE DRAWINGS

Figure 1:
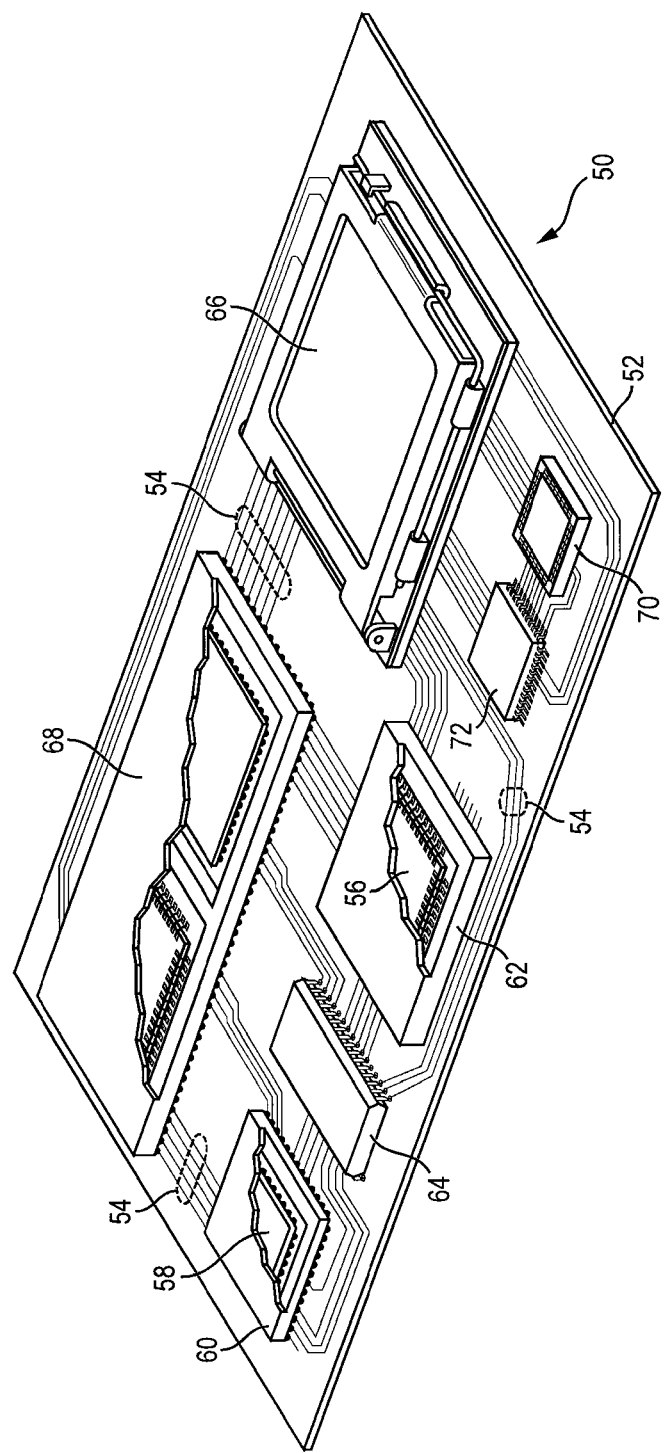
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping, arranged as necessary, to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve spin-coating, chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with conductive bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For purpose of illustration, several types of first level packaging, including bond wire package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because semiconductor packages include sophisticated functionality, electronic devices can be manufactured using cheaper components and a streamlined manufacturing process. Resulting devices are less likely to fail and less expensive to manufacture resulting in a lower cost for consumers.

Figure 2A:
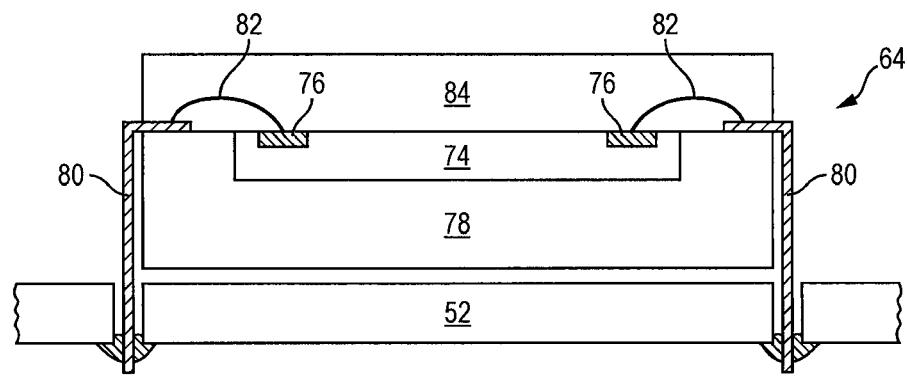
FIGS. 2a-2c illustrate further detail of the semiconductor packages mounted to the PCB.
Figure 2B:
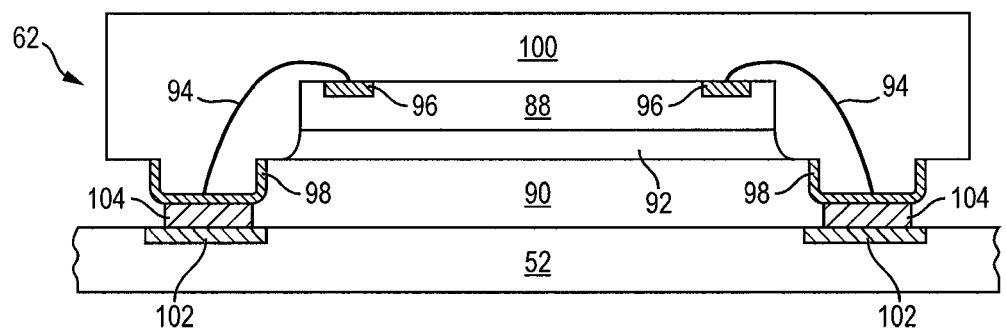
Figure 2C:
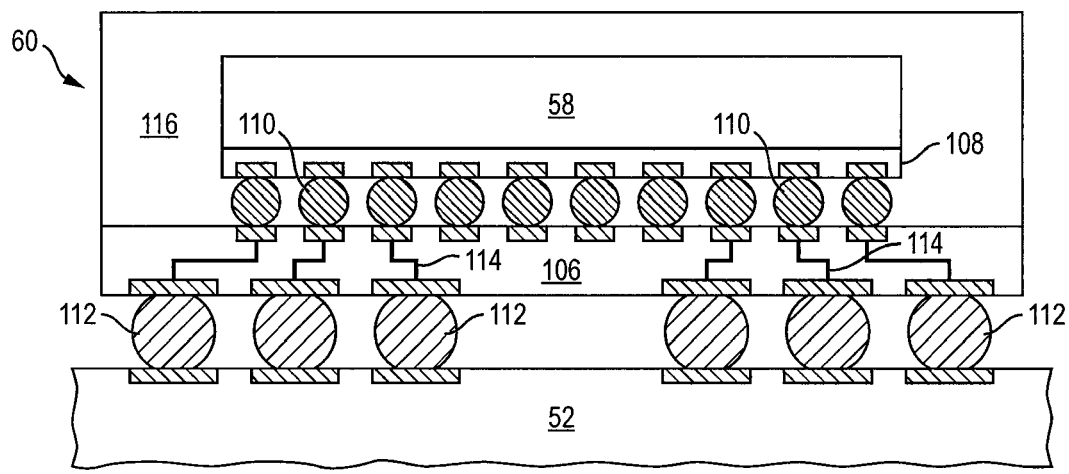

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to an electrical design of the die. For example, the circuit can include one or more transistors, diodes, inductors, capacitors, resistors, and other circuit elements formed within active regions of semiconductor die 74. Contact pads 76 are one or more layers of conductive material, such as aluminum (Al), copper (Cu), tin (Sn), nickel (Ni), gold (Au), or silver (Ag), and are electrically connected to circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. A package body includes an insulating packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

FIG. 2c illustrates further detail of BGA 60 mounted on PCB 52. In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to an electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without an intermediate carrier 106.

Figure 3A:
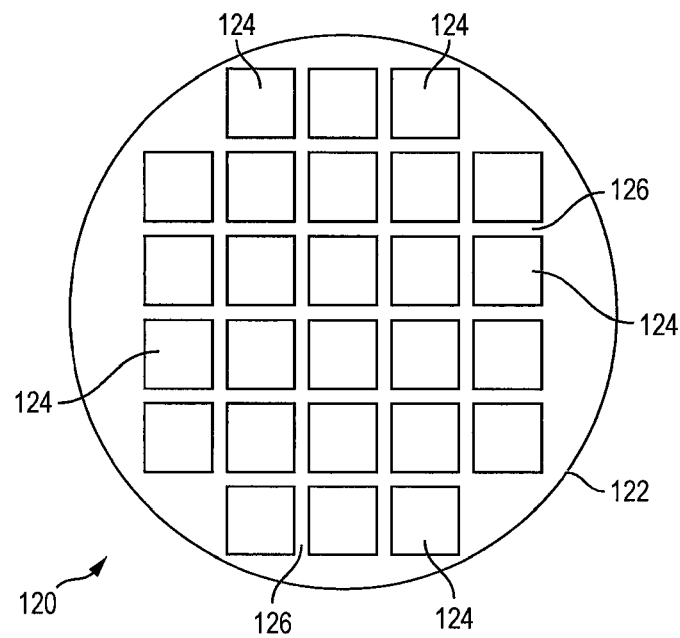
FIGS. 3a-3c illustrate a semiconductor wafer with a plurality of semiconductor die separated by saw streets.

FIG. 3a shows a semiconductor wafer 120 with a base substrate material 122, such as silicon (Si), germanium (Ge), gallium arsenide (GaAs), indium phosphide (InP), or silicon carbide (SiC), for structural support. A plurality of semiconductor die or components 124 is formed on wafer 120 separated by saw streets 126, as described above.

Figure 3B:
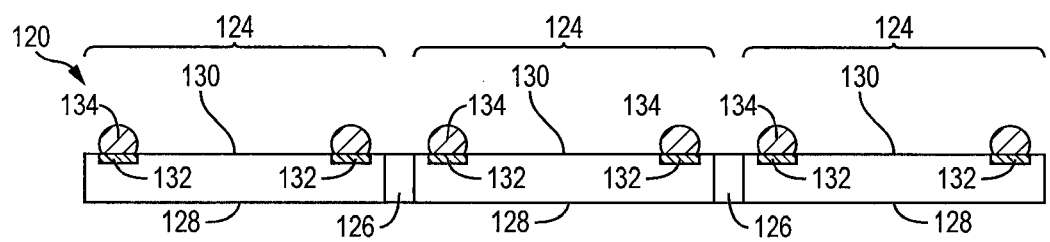

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to an electrical design and function of the die. For example, a circuit can include one or more transistors, diodes, and other circuit elements formed within active surface 130 to implement analog circuits or digital circuits, such as digital signal processor (DSP), ASIC, memory, or other signal processing circuit. Semiconductor die 124 can also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to circuits on active surface 130. Conductive bumps 134 are formed on contact pads 132. In one embodiment, semiconductor die 124 is a flip chip type semiconductor die and conductive bumps 134 are micro bumps.

Figure 3C:
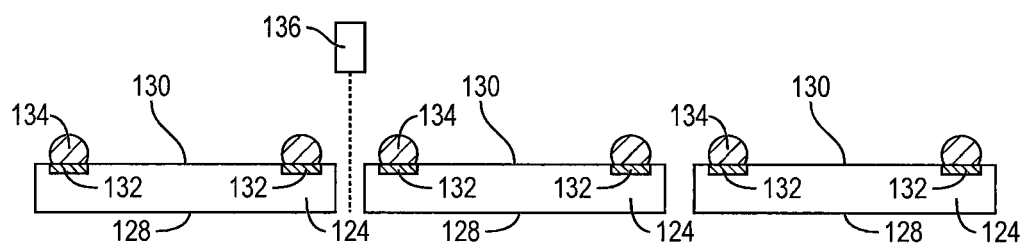

In FIG. 3c, semiconductor wafer 120 is singulated through saw street 126 using saw blade or laser cutting tool 136 into individual semiconductor die 124. Each semiconductor die 124 has bumps 134 formed over contact pads 132.

Figure 4:
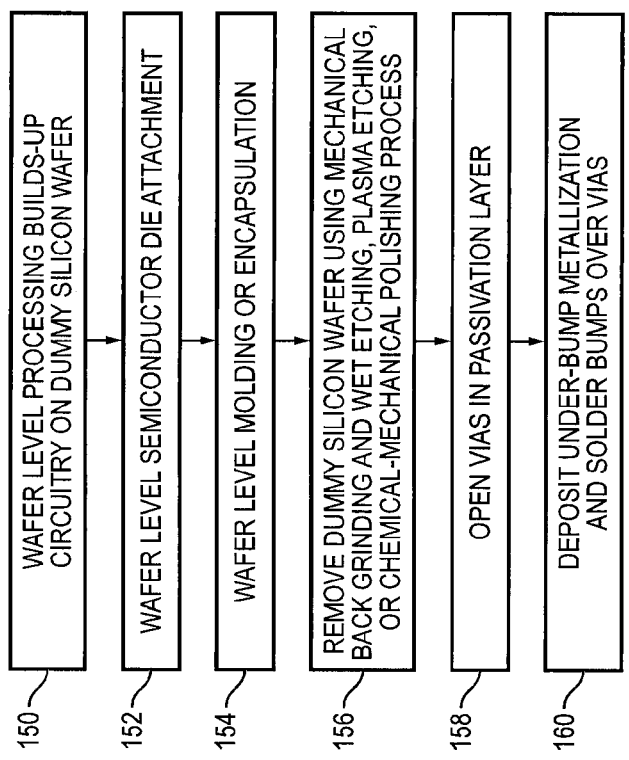
FIG. 4 illustrates a process of manufacturing a WLCSP.

FIG. 4 illustrates a process of manufacturing a WLCSP. In a first step 150, a WL process is used to form circuitry over a dummy silicon wafer. WL processing may include any semiconductor device fabrication processes such as WL redistribution, material deposition and removal processes, patterning for removing material from the wafer, and doping for changing electrical characteristics of the wafer. During WL processing, single or multiple layers of material may be deposited and patterned on the dummy silicon wafer. In step 152, semiconductor die are connected to contact pads formed upon the wafer using a bonding or flip chip connection process. In step 154, an encapsulant or molding compound is deposited over the wafer and attached semiconductor die. The molding or encapsulation compound may include any suitable material as described below. In step 156, the dummy silicon wafer is removed using mechanical back grinding and wet etching, plasma etching, or chemical-mechanical polishing. After the dummy silicon wafer is removed, optional step 158 opens vias in one or more insulating layers that were deposited during WL processing. Vias may be opened using a lithography and/or etching process. In optional step 160, an under bump metallization (UBM) and conductive bumps are deposited over vias that were formed in step 158.

FIGS. 5a-5g illustrate formation of a WL interconnect structure for use with WLCSP or other semiconductor devices in accordance with one embodiment.

Figure 5A:
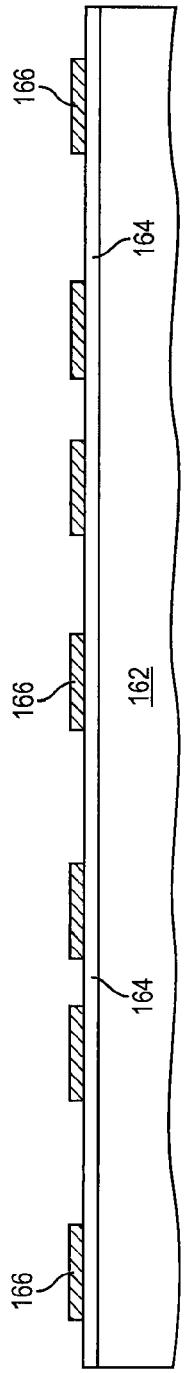
FIGS. 5a-5g illustrate formation of an interconnect structure for semiconductor die using a RDL in accordance with one embodiment.

In FIG. 5a, a low cost dummy substrate or carrier 162 containing temporary or sacrificial base material such as silicon, polymer, beryllium oxide, a composite material with an appropriate coefficient of thermal expansion (CTE), or other suitable low-cost, rigid material is provided for structural support. Substrate 162 is a temporary and sacrificial supporting wafer substrate, and is capable of supporting processing temperatures equal to or greater than 200° C.

Next, a passivation or insulating layer 164 is applied over substrate 162. Insulating layer 164 can be formed using PVD, CVD, printing, spin coating, spray coating, sintering or thermal oxidation. Insulating layer 164 contains one or more layers of silicon nitride (Si3N4), silicon dioxide (SiO2), silicon oxynitride (SiON), SiO2/Si3N4, tantalum pentoxide (Ta2O5), aluminum oxide (Al2O3), or other material having similar insulating and structural properties. In some alternate embodiments, insulating layer 164 can be replaced by a conductive layer, such as Cu. Insulating layer 164 is chosen to have good selectivity as a silicon etchant so it can act as an etch stop during later removal of the dummy substrate. Insulating layer 164 can be formed and cured at temperatures equal to or greater than 200° C.

Next, an electrically conductive layer 166 is formed as a contact pad using a patterning and deposition process. Conductive layer 166 can be made with a conductive material, such as Al, Cu, Sn, Ni, Au, Ag, or other electrically conductive material. Deposition of conductive layer 166 uses PVD, CVD, electrolytic plating, or an electroless plating process. Portions of conductive layer 166 can be electrically common or electrically isolated depending on a design and function of semiconductor die that are subsequently electrically connected to conductive layer 166.

Figure 5B:
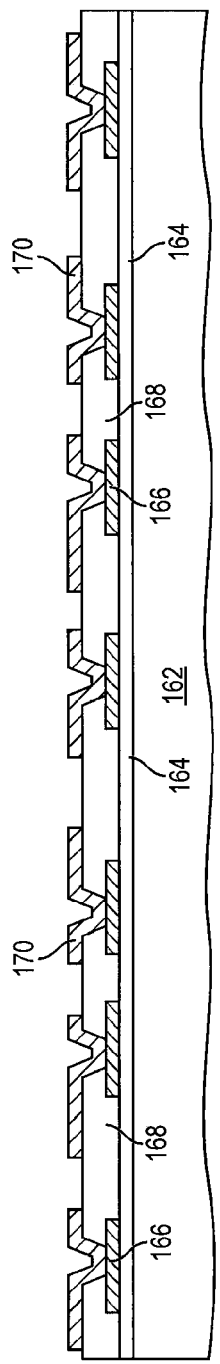

In FIG. 5b, a passivation or insulating layer 168 is applied over insulating layer 164 and conductive layer 166 for structural support and electrical isolation. Insulating layer 168 can be formed using PVD, CVD, printing, spin coating, spray coating, sintering or thermal oxidation. Insulating layer 168 can have one or more layers of Si3N4, SiO2, SiON, polyimide (PI), benzocyclobutene (BCB), polybenzoxazole (PBO), WPR, epoxy, or other material having similar insulating and structural properties. Insulating layer 168 can be formed and cured at temperatures equal to or greater than 200° C. Next, a portion of insulating layer 168 is removed using a mask-defined etching process to expose conductive layer 166.

An electrically conductive layer 170 is conformally deposited over insulating layer 168. Conductive layer 170 can be formed using a PVD, CVD, electrolytic plating, or electroless plating process. Conductive layer 170 can be made with Al, Ni, nickel vanadium (NiV), Cu, Cu alloy, or some other electrically conductive material. Conductive layer 170 can be formed with a single layer, or alternatively with multiple layers including an adhesion layer of titanium (Ti), titanium tungsten (TiW), or chromium (Cr). Conductive layer 170 follows a contour of insulating layer 168. That is, conductive layer 170 covers an upper surface and sidewalls of insulating layer 168. Conductive layer 170 physically contacts conductive layer 166 through insulating layer 168 and is electrically connected to conductive layer 166. Portions of conductive layer 170 can be electrically common or electrically isolated depending on a design and function of semiconductor die that are subsequently electrically connected to conductive layer 170.

Figure 5C:
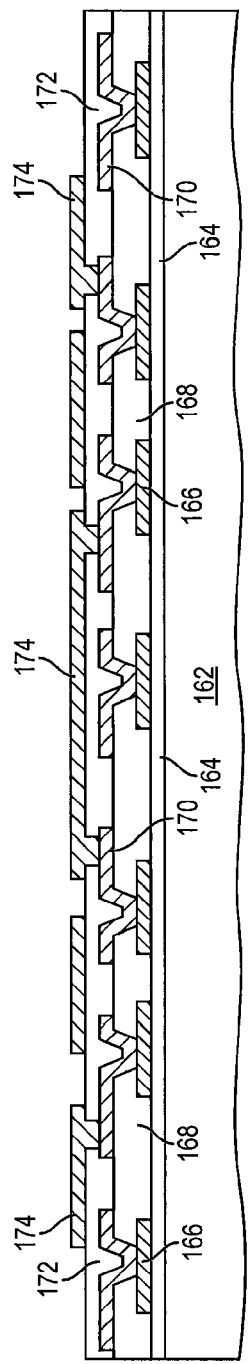

In FIG. 5c, a passivation or insulating layer 172 is applied over insulating layer 168 and conductive layer 170 for structural support and electrical isolation. Insulating layer 172 can be formed using PVD, CVD, printing, spin coating, spray coating, sintering or thermal oxidation. Insulating layer 172 can have one or more layers of Si3N4, SiO2, SiON, PI, BCB, PBO, WPR, epoxy, or other material having similar insulating and structural properties. Insulating layer 172 can be formed and cured at temperatures equal to or greater than 200° C. A portion of insulating layer 172 is removed using a mask-defined etching process to expose conductive layer 170.

An electrically conductive layer 174 is deposited over insulating layer 172 in electrical contact with conductive layer 170. Conductive layer 174 can be deposited using a PVD, CVD, electrolytic plating, or electroless plating process. Conductive layer 174 can be made with Al, Cu, Sn, Ni, Au, Ag, or some other electrically conductive material. Conductive layer 174 physically contacts conductive layer 170 through insulating layer 172 and is electrically connected to conductive layer 170. Portions of conductive layer 174 can be electrically common or electrically isolated depending on a design and function of semiconductor die that are subsequently electrically connected to conductive layer 174.

Figure 5D:
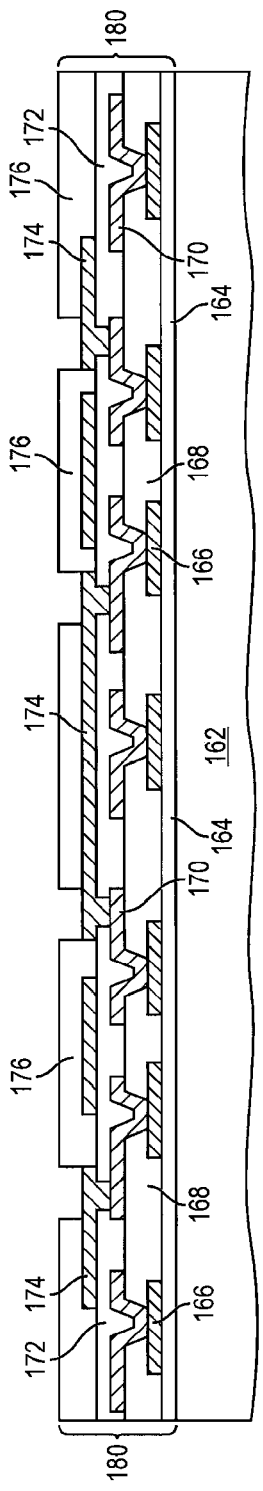

Next, as shown in FIG. 5d, a passivation or insulating layer 176 is applied over insulating layer 172 and conductive layer 174 for structural support and electrical isolation. Insulating layer 176 can be formed using PVD, CVD, printing, spin coating, spray coating, sintering or thermal oxidation. Insulating layer 176 can have one or more layers of Si3N4, SiO2, SiON, PI, BCB, PBO, WPR, epoxy, or other material having similar insulating and structural properties. Insulating layer 176 can be formed and cured at temperatures equal to or greater than 200° C. A portion of insulating layer 176 is removed using a mask-defined etching process to expose conductive layer 174. Insulating layer 176 is optional.

Insulating layer 164, conductive layer 166, insulating layer 168, conductive layer 170, insulating layer 172, conductive layer 174, and insulating layer 176 constitute a wafer level redistribution layer (WL RDL) or interconnect structure 180. WL RDL 180 is implemented through an interconnect circuit build-up process, as described above, to provide electrical connection between semiconductor die 124, as well as electrical connection to conductive bumps 194, as described hereinafter.

Figure 5E:
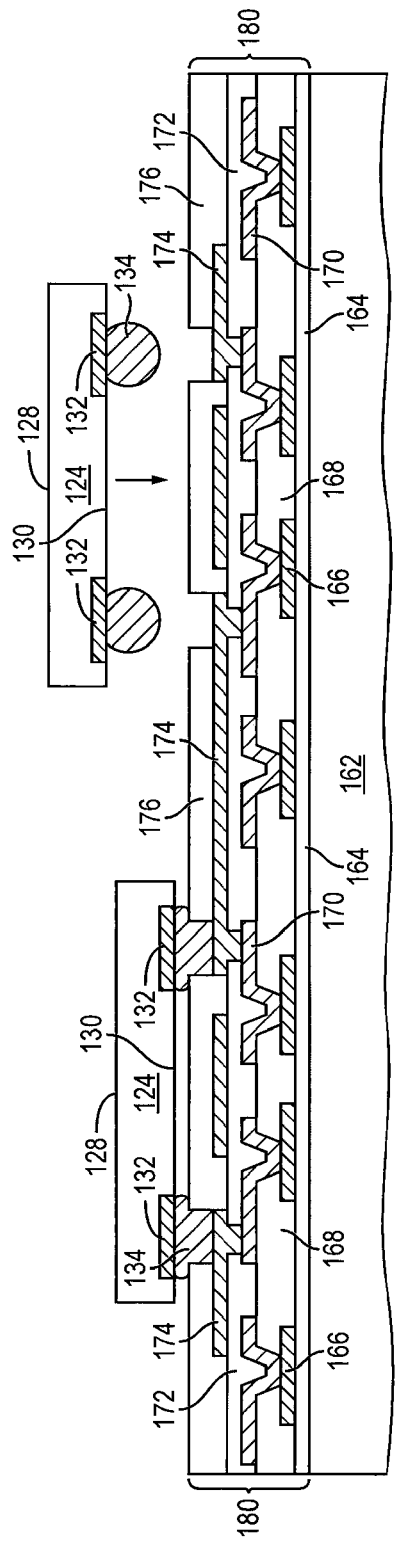

In FIG. 5e, semiconductor die 124 have contact pads 132 formed on active surfaces 130, and conductive bumps 134 formed on contact pads 132. Semiconductor die 124 are mounted to conductive layer 174 using a pick-and-place operation by placing conductive bumps 134 in contact with conductive layer 174 through insulating layer 176 or by flip chip interconnect, which electrically connects contact pads 132 to conductive layer 174. Then, conductive bumps 134 are reflowed to improve the electrical and mechanical contact between contact pads 132, bumps 134, and conductive layer 174.

Semiconductor die 124 represent various IC dies and discrete components that can be mounted on a top surface of WL RDL 180 and connected to conductive layers of the WL RDL 180. Semiconductor die 124 each include active and passive devices, conductive layers, and dielectric layers on the active surface according to the electrical design of the die. The discrete components can be filters, discrete passive devices, such as inductors, resistors, or capacitors, or other discrete devices.

Figure 5F:
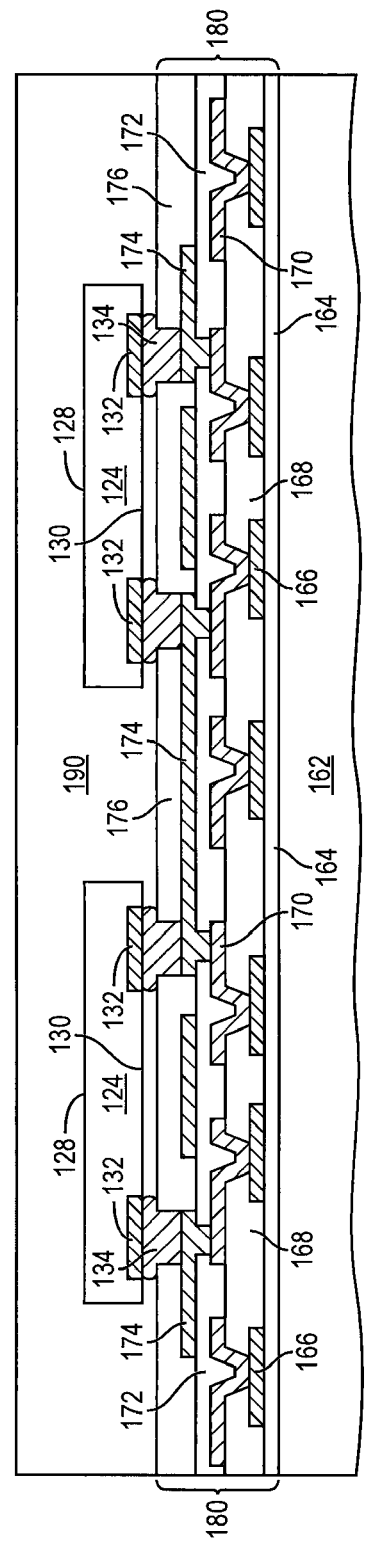

In FIG. 5f, an encapsulant or molding compound 190 is deposited on a top surface of WL RDL 180 and over semiconductor die 124 using a paste printing, compressive molding, transfer molding, liquid encapsulant molding, vacuum lamination, or other suitable applicator. Encapsulant 190 can be polymer composite material, such as epoxy resin with filler, epoxy acrylate with filler, or polymer with proper filler. Encapsulant 190 is non-conductive, provides physical support, and environmentally protects the semiconductor device from external elements and contaminants. In one embodiment, a backside 128 of semiconductor die 124 can be exposed in the molding process. In one embodiment, encapsulant 190 is deposited using a film-assisted molding process.

Figure 5G:
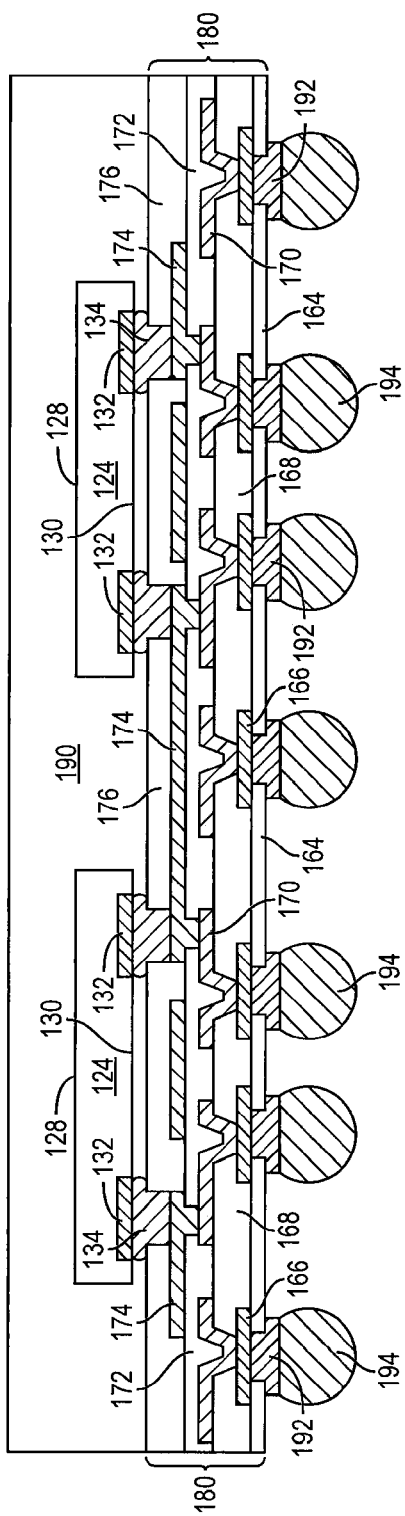

In FIG. 5g, dummy substrate 162 is removed by mechanical backgrinding, chemical wet etching, plasma dry etching, or chemical mechanical polishing (CMP). Insulating layer 164 is patterned and etched to expose conductive layer 166. Alternatively, insulating layer 164 can be patterned and etched before conductive layer 166 is formed on substrate 162.

Next, a UBM or conductive layer 192 is deposited over insulating layer 164 by an evaporation, electrolytic plating, electroless plating, or screen printing process. Conductive layer 192 can be made with Ti, Ni, NiV, Cu, or Cu alloy. Conductive layer 192 is a UBM in electrical contact with conductive layer 166.

In some embodiments, UBMs 192 can be a multiple metal stack with adhesion layer, barrier layer, and wetting layer. An adhesion layer contacts conductive layer 166 and can be made with Ti, Cr, Al, TiW, or titanium nitride (TiN). A barrier layer is formed over the adhesion layer and can be made with Ni, NiV, chromium copper (CrCu), or TiW. A wetting layer is formed over the barrier layer and can be made with Cu, Au, or Ag. UBMs 192 can be electroless Ni or Au on conductive layer 166 for both conductive bumps and wire bonding.

After removing supporting wafer substrate 162 by backgrinding or etching, an electrically conductive material is deposited over UBMs 192 using an electrolytic plating or electroless plating process. The electrically conductive material can be any solder, metal, or metal alloy, e.g., Sn, lead (Pb), Ni, Au, Ag, Cu, bismuthinite (Bi) and alloys thereof. In one embodiment, the electrically conductive material is 63 percent weight of Sn and 37 percent weight of Pb. The electrically conductive material is reflowed by heating the conductive material above its melting point to form spherical balls or bumps 194. In some applications, conductive bumps 194 are reflowed a second time to improve electrical contact to the UBM structure. Bumps 194 can also be compression bonded to UBMs 192. Bumps 194 represent one type of interconnect structure that can be formed over UBMs 192. The interconnect structure can also use bond wires, conductive paste, stud bump, micro bump, or other electrical interconnect.

WL RDL 180 is a single or multiple layer WL interconnect structure. The multiple layers may include one or more conductive layers and insulating layers, such as flip-on-chip (FOC), BCB RDLs, PI RDLs, and PI/BCB repassivation. The processing temperature used in forming WL RDL 180 is typically greater than 200° C., but can be lower. WL RDL 180 provides a complete WL interconnect for semiconductor die 124 according to their functional design. The electrical signals from semiconductor die 124 are routed through WL RDL 180 to one or more conductive bumps 194 according to the function of the semiconductor device. Conductive bumps 194 are optional.

As described in FIGS. 5*a*-5*g*, WL RDL 180 is formed on dummy substrate 162 prior to mounting semiconductor die 124. Once semiconductor die 124 are mounted and encapsulated, the dummy substrate 162 is removed so external interconnects such as UBMs 192 and conductive bumps 194 can be formed. By forming WL RDL 180 on a dummy substrate 162 prior to mounting semiconductor die 124, a processing temperature restriction due to the WL RDL process noted in the background section can be reduced. In other words, since the process does not use a substrate with a Tg that is less than 200° C., temperatures equal to or greater than 200° C. can be used to form WL RDL 180. In addition, inter-wafer and intra-wafer registration variation of semiconductor die can be reduced by mounting the die to the patterned dummy substrate. The process improves manufacturability, flexibility, wafer integration, and self-alignment effect of the WLCSP.

Figure 6A:
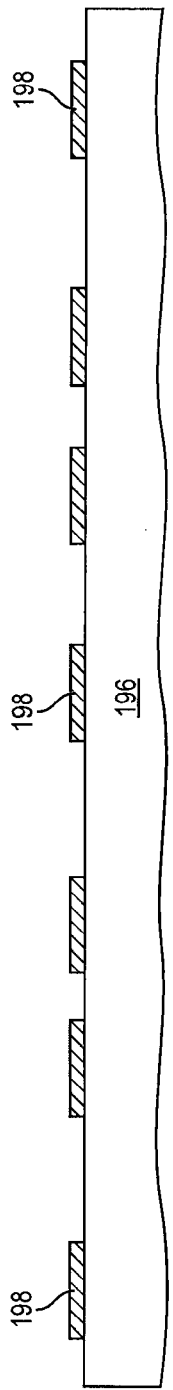

FIGS. 6*a*-6*g* illustrate formation of a WL interconnect structure for use with WLCSP or other semiconductor devices in accordance with another embodiment. In FIG. 6*a*, a low cost dummy substrate or carrier 196 containing temporary or sacrificial base material such as silicon, polymer, beryllium oxide, a composite material with an appropriate coefficient of thermal expansion (CTE), or other suitable low-cost, rigid material is provided for structural support. Substrate 196 is a temporary and sacrificial supporting wafer substrate, and is capable of supporting processing temperatures equal to or greater than 200° C.

Next, an electrically conductive multi-layer 198 is formed over dummy substrate 196 as a contact pad using a patterning and deposition process. Conductive multi-layer 198 can include a wetting layer, an optional barrier layer, and an adhesive layer. A wetting layer of conductive multi-layer 198 is deposited on dummy substrate 196 and can be made with Cu, Au, Ag, or other electrically conductive material. An optional barrier layer of conductive multi-layer 198 is deposited on the wetting layer and can be made with Ni, NiV, CrCu, TiW, or other electrically conductive material. An adhesive layer of conductive multi-layer 198 is deposited either on the wetting layer or the optional barrier layer and can be made with Ti, Cr, Al, TiW, TiN, or other electrically conductive material. The deposition of conductive multi-layer 198 uses PVD, CVD, electrolytic plating, or an electroless plating process.

Unlike the embodiment of FIG. 5*a*, the process step of FIG. 6*a* does not form an insulating layer (such as insulating layer 164 of FIG. 5*a*) on dummy substrate 196 prior to forming conductive multi-layer 198 directly on dummy substrate 196. Conductive multi-layer 198 constitutes a UBM 198 to which wire bonds or conductive bumps can be subsequently bonded.

Figure 6B:
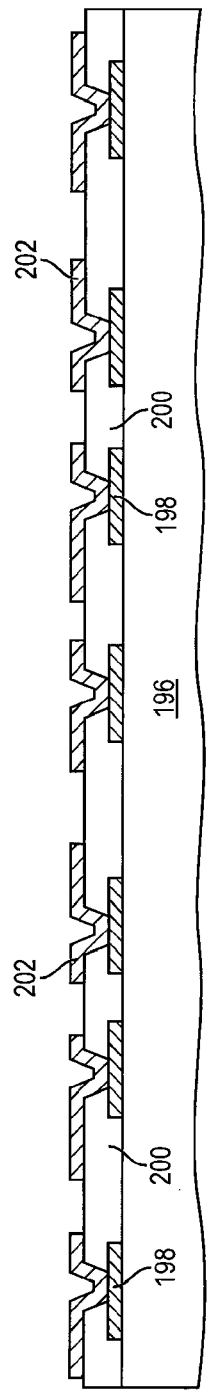

In FIG. 6*b*, a passivation or insulating layer 200 is formed over conductive multi-layer 198 for structural support and electrical isolation. Insulating layer 200 can be formed using PVD, CVD, printing, spin coating, spray coating, sintering or thermal oxidation. Insulating layer 200 can have one or more layers of Si3N4, SiO2, SiON, PI, BCB, PBO, WPR, epoxy, or other insulating material. Insulating layer 200 can be formed and cured at temperatures equal to or greater than 200° C. Next, a portion of insulating layer 200 is removed using a mask-defined etching process to expose conductive multi-layer 198.

An electrically conductive layer 202 is conformally deposited over insulating layer 200. Conductive layer 202 can be deposited using a PVD, CVD, electrolytic plating, or electroless plating process. Conductive layer 202 can be made with Al, Ni, NiV, Cu, or Cu alloy. Conductive layer 202 follows the contour of insulating layer 200. That is, conductive layer 202 covers an upper surface and sidewalls of insulating layer 200. Conductive layer 202 physically contacts conductive multi-layer 198 through insulating layer 200 and is electrically connected to conductive multi-layer 198. Conductive layer 202 can be made with a single layer, or alternatively with multiple layers including an adhesion layer of Ti, TiW, or Cr.

In FIG. 6*c*, a passivation or insulating layer 204 is formed over insulating layer 200 and conductive layer 202 for structural support and electrical isolation. Insulating layer 204 can be formed using PVD, CVD, printing, spin coating, spray coating, sintering or thermal oxidation. Insulating layer 204 can have one or more layers of Si3N4, SiO2, SiON, PI, BCB, PBO, WPR, epoxy, or other insulating material. Insulating layer 204 can be formed and cured at temperatures equal to or greater than 200° C. A portion of insulating layer 204 is removed using a mask-defined etching process to expose conductive layer 202.

An electrically conductive layer 206 is deposited over insulating layer 204 in electrical contact with conductive layer 202. Conductive layer 206 can be deposited using a PVD, CVD, electrolytic plating, or electroless plating process. Conductive layer 206 can be made with Al, Cu, Sn, Ni, Au, Ag, or some other electrically conductive material.

Next, as shown in FIG. 6*d*, a passivation or insulating layer 208 is formed over insulating layer 204 and conductive layer 206 for structural support and electrical isolation. Insulating layer 208 can be formed using PVD, CVD, printing, spin coating, spray coating, sintering or thermal oxidation. Insulating layer 208 can have one or more layers of Si3N4, SiO2, SiON, PI, BCB, PBO, WPR, epoxy, or other insulating material. Insulating layer 208 can be formed and cured at temperatures equal to or greater than 200° C. A portion of insulating layer 208 is removed using a mask-defined etching process to expose conductive layer 206. Insulating layer 208 is optional.

Conductive multi-layer or UBM 198, insulating layer 200, conductive layer 202, insulating layer 204, conductive layer 206, and insulating layer 208 constitute a WL RDL or interconnect structure 212. WL RDL 212 is implemented through an interconnect circuit build-up process, as described above, to provide electrical connection between semiconductor die 124, as well as electrical connection to conductive bumps 224, as described hereinafter.

In FIG. 6e, semiconductor die 124 have contact pads 132 formed on active surfaces 130. Semiconductor die 124 are mounted to conductive layer 206 using a pick-and-place operation by placing conductive bumps 134 in contact with conductive layer 206 through insulating layer 208 or by flip chip interconnect, which electrically connects contact pads 132 to conductive layer 206. Then, conductive bumps 134 are reflowed to improve an electrical and mechanical contact between contact pads 132, bumps 134, and conductive layer 206.

Semiconductor die 124 represent various IC dies and discrete components that can be mounted on a top surface of WL RDL 212 and connected to conductive layers of interconnect structure 212. Semiconductor die 124 each include active and passive devices, conductive layers, and dielectric layers on an active surface according to an electrical design of semiconductor die 124. Discrete components can be filters, discrete passive devices, such as inductors, resistors, or capacitors, or other discrete devices.

Figure 6F:
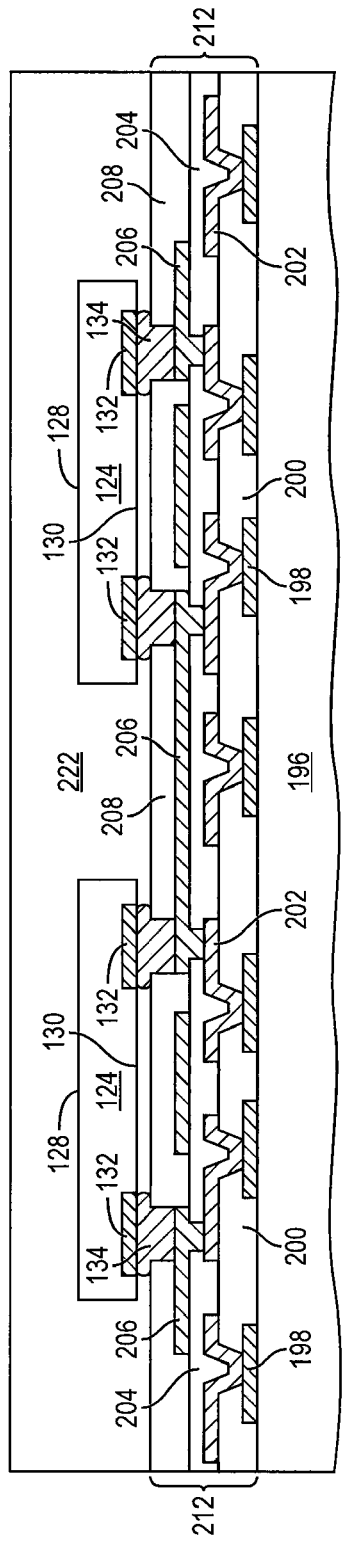

In FIG. 6f, an encapsulant or molding compound 222 is deposited on a top surface of WL RDL 212 and over semiconductor die 124 using a paste printing, compressive molding, transfer molding, liquid encapsulant molding, vacuum lamination, or other suitable applicator. Encapsulant 222 can be polymer composite material, such as epoxy resin with filler, epoxy acrylate with filler, or polymer with proper filler. Encapsulant 222 is non-conductive, provides physical support, and environmentally protects the semiconductor device from external elements and contaminants. In one embodiment, backsides 128 of semiconductor die 124 can be exposed in the molding process. In one embodiment, encapsulant 222 is deposited using a film-assisted molding process.

Figure 6G:
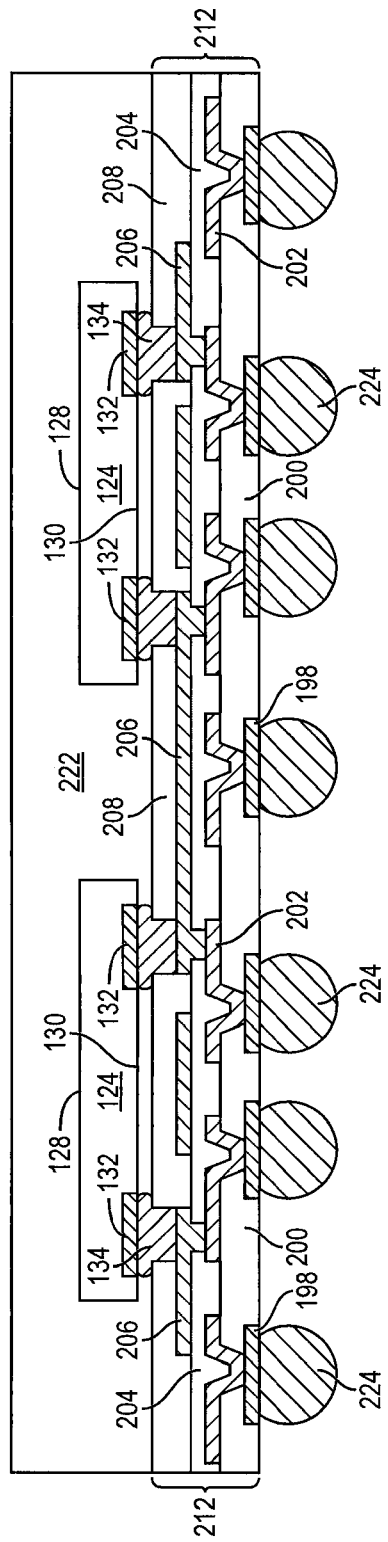

In FIG. 6g, dummy substrate 196 is removed to expose conductive multi-layer or UBMs 198. Dummy substrate 196 can be removed by mechanical backgrinding, chemical wet etching, plasma dry etching, or CMP. After removing dummy substrate 196 by backgrinding, etching, or CMP, an electrically conductive material is deposited over UBMs 198 using an electrolytic plating or electroless plating process. An electrically conductive material can be any solder, metal, or metal alloy, e.g., Sn, Pb, Ni, Au, Ag, Cu, Bi and alloys thereof. In one embodiment, an electrically conductive material is 63 percent weight of Sn and 37 percent weight of Pb. An electrically conductive material is reflowed by heating the conductive material above its melting point to form spherical balls or bumps 224. In some applications, conductive bumps 224 are reflowed a second time to improve electrical contact with conductive multi-layer or UBMs 198. Bumps 224 can also be compression bonded to UBMs 198. Bumps 224 represent one type of interconnect structure that can be formed over UBMs 198. An interconnect structure can also use bond wires, conductive paste, stud bump, micro bump, or other electrical interconnect.

WL RDL 212 can be a single or multiple layer wafer level interconnect structure. Multiple layers may include one or more conductive layers and insulating layers, such as flip-on-chip (FOC), BCB RDLs, PI RDLs, and PI/BCB repassivation. A processing temperature used in forming WL RDL 212 is typically greater than 200° C., but can be lower. WL RDL 212 provides a complete wafer level interconnect for semiconductor die 124 according to its functional design. Electrical signals from semiconductor die 124 are routed through WL RDL 212 to one or more conductive bumps 224 according to a function of the semiconductor device. Conductive bumps 224 are optional.

As described in FIGS. 6a-6g, WL RDL 212 is formed on dummy substrate 196 prior to mounting semiconductor die 124. Once semiconductor die 124 are mounted and encapsulated, dummy substrate 196 can be removed so external interconnects such as conductive bumps 224 can be formed. By forming WL RDL 212 on dummy substrate 196 prior to mounting semiconductor die 124, a processing temperature restriction due to a conventional WL RDL process that was noted in the background section can be reduced. In other words, since some embodiments do not use a substrate with a Tg that is less than 200° C., temperatures equal to or greater than 200° C. can be used to form WL RDL 212. In addition, inter-wafer and intra-wafer registration variation of semiconductor die can be reduced by mounting a die to a patterned dummy substrate. The process improves manufacturability, flexibility, wafer integration, and self-alignment effect of a WLCSP.

Figure 7:
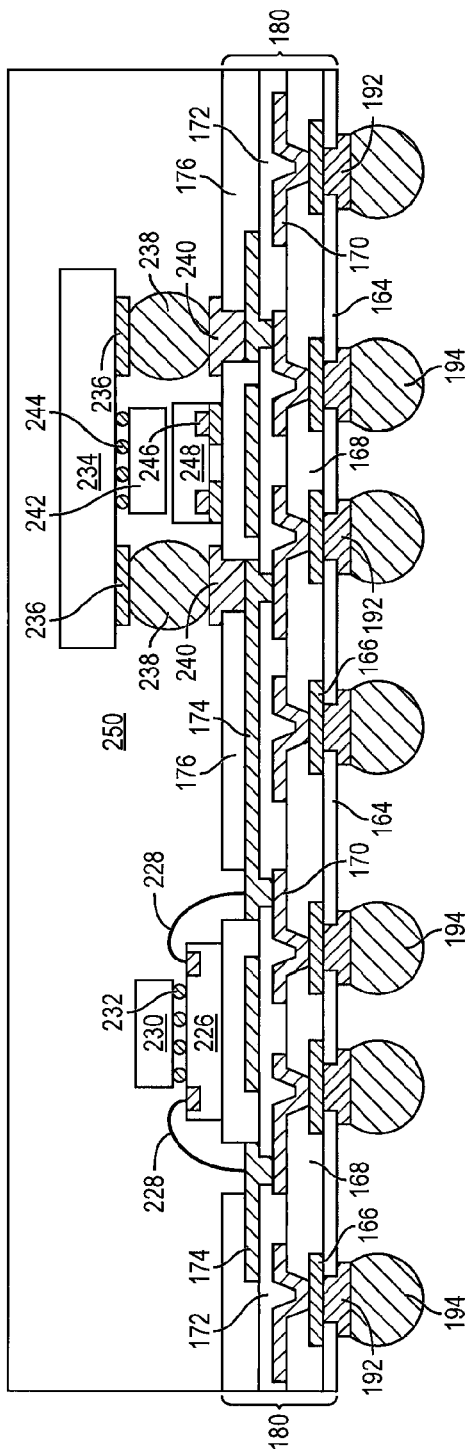
FIG. 7 illustrates an alternate embodiment of the interconnect structure for the semiconductor die using conductive bumps and bond wires.

Another wafer level interconnect structure is shown in FIG. 7. WL RDL 180 is formed as described above with reference to FIGS. 5a-5d. After formation of WL RDL 180, contact pads of semiconductor die 226 are electrically connected to conductive layer 174 by bond wires 228. Flip chip semiconductor package 230 is electrically connected to semiconductor die 226 with conductive bumps 232. Contact pads 236 of semiconductor die 234 are electrically connected to conductive layer 174 through conductive bumps 238 and UBMs 240. Flip chip semiconductor package 242 is electrically connected to semiconductor die 234 with conductive bumps 244. Contact pads 246 of semiconductor die 248 are electrically connected to conductive layer 174. Semiconductor die 248 can be an IC or a passive device that is surface mounted to WL RDL 180.

An encapsulant or molding compound 250 is formed over semiconductor die 226, 230, 234, 242, and 248 and underlying WL RDL 180. Encapsulant 250 can be made with epoxy or polymer material.

After removing dummy substrate 162 (as previously described with reference to FIGS. 5f and 5g) by mechanical back grinding, chemical wet etching, plasma dry etching, or CMP, insulating layer 164 is patterned and etched to expose conductive layer 166. UBMs 192 are formed in electrical contact with conductive layer 166 and conductive layer 170.

An electrically conductive bump material is deposited over UBMs 192 using an evaporation, electrolytic plating, electroless plating, ball drop, or screen printing process. A conductive bump material can be Al, Sn, Ni, Au, Ag, Pb, bismuth (Bi), Cu, solder, and combinations thereof, with an optional flux solution. For example, a bump material can be eutectic Sn/Pb, high-lead solder, or lead-free solder. A bump material is bonded to UBMs 192 using a suitable attachment or bonding process. In one embodiment, a bump material is reflowed by heating bump material above its melting point to form spherical balls or bumps 194. In some applications, bumps 194 are reflowed a second time to improve electrical contact to UBMs 192. Bumps 194 can also be compression bonded to UBMs 192. Bumps 194 represent one type of interconnect structure that can be formed over UBMs 192.

An interconnect structure can also use bond wires, conductive paste, stud bump, micro bump, or other electrical interconnect.

Figure 8:
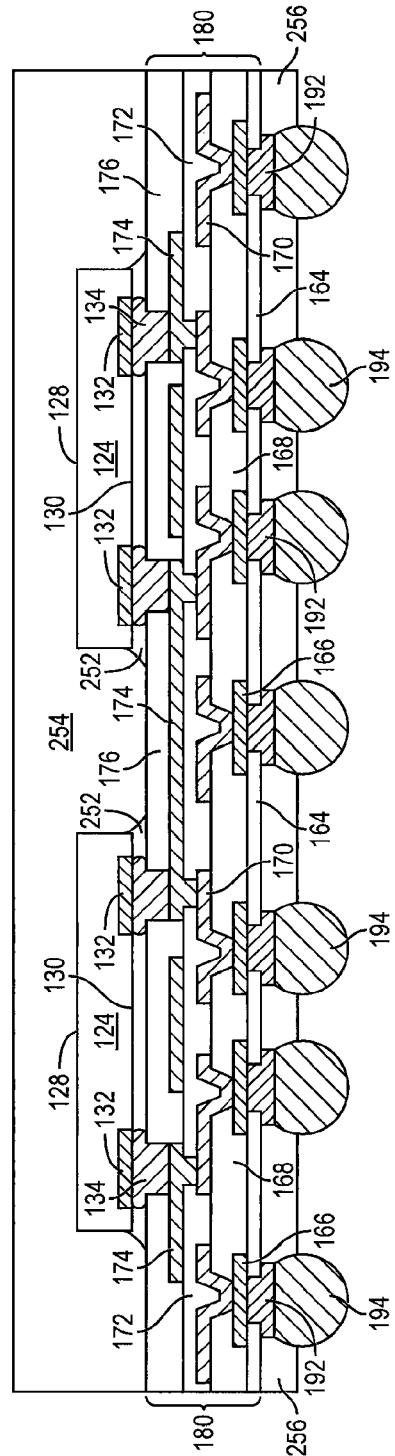
FIG. 8 illustrates an alternate embodiment of an interconnect structure with underfill under the semiconductor die and a second insulating layer around the backside conductive bumps.

FIG. 8 illustrates an alternate embodiment of an interconnect structure with an underfill under semiconductor die 124 and a second insulating layer around backside conductive bumps 194. In FIG. 8, WL RDL 180 is formed and semiconductor die 124 are mounted to WL RDL 180 as was described above with reference to FIGS. 5a-5e. An underfill material 252 is disposed under semiconductor die 124. Underfill material 252 can be made with epoxy, polymeric material, film, or other non-conductive material. An encapsulant or molding compound 254 is formed over semiconductor die 124 and underlying WL RDL 180.

In some embodiments, underfill material 252 is a no-flow underfill, which can be disposed on insulating layer 176 prior to mounting semiconductor die 124 to conductive layer 174. An advantage of using a no-flow underfill is that underfill material 252 can be applied and cured before and/or during a reflow process, if any, for bumps 134, which can increase manufacturing throughput.

As was described above with reference to FIGS. 5f-5g, dummy substrate 162 can be removed by mechanical back grinding, chemical wet etching, plasma dry etching, or CMP. Insulating layer 164 can be patterned and etched to expose conductive layer 166. UBMs 192 are formed in electrical contact with conductive layer 166 and conductive layer 170. An electrically conductive solder material can be deposited over UBMs 192 using an electrolytic plating or electroless plating process.

Next, an insulating layer 256 can be formed over insulating layer 164 for structural support and electrical isolation. Insulating layer 256 can be formed over insulating layer 164 using, e.g., a spin-coating process. Insulating layer 256 can have one or more layers of Si3N4, SiO2, SiON, PI, BCB, PBO, WPR, epoxy, or other insulating material. A portion of insulating layer 256 can be removed using a mask-defined etching process to expose UBMs 192.

An electrically conductive bump material is deposited over UBMs 192 using an evaporation, electrolytic plating, electroless plating, ball drop, or screen printing process. Bump material can be Al, Sn, Ni, Au, Ag, Pb, bismuth (Bi), Cu, solder, and combinations thereof, with an optional flux solution. For example, a bump material can be eutectic Sn/Pb, high-lead solder, or lead-free solder. A bump material is bonded to UBMs 192 using a suitable attachment or bonding process. In one embodiment, a bump material is reflowed by heating bump material above its melting point to form spherical balls or bumps 194. In some applications, bumps 194 are reflowed a second time to improve electrical contact to UBMs 192. Bumps 194 can also be compression bonded to UBMs 192. Bumps 194 represent one type of interconnect structure that can be formed over UBMs 192. An interconnect structure can also use bond wires, conductive paste, stud bump, micro bump, or other electrical interconnect.

Figure 9:
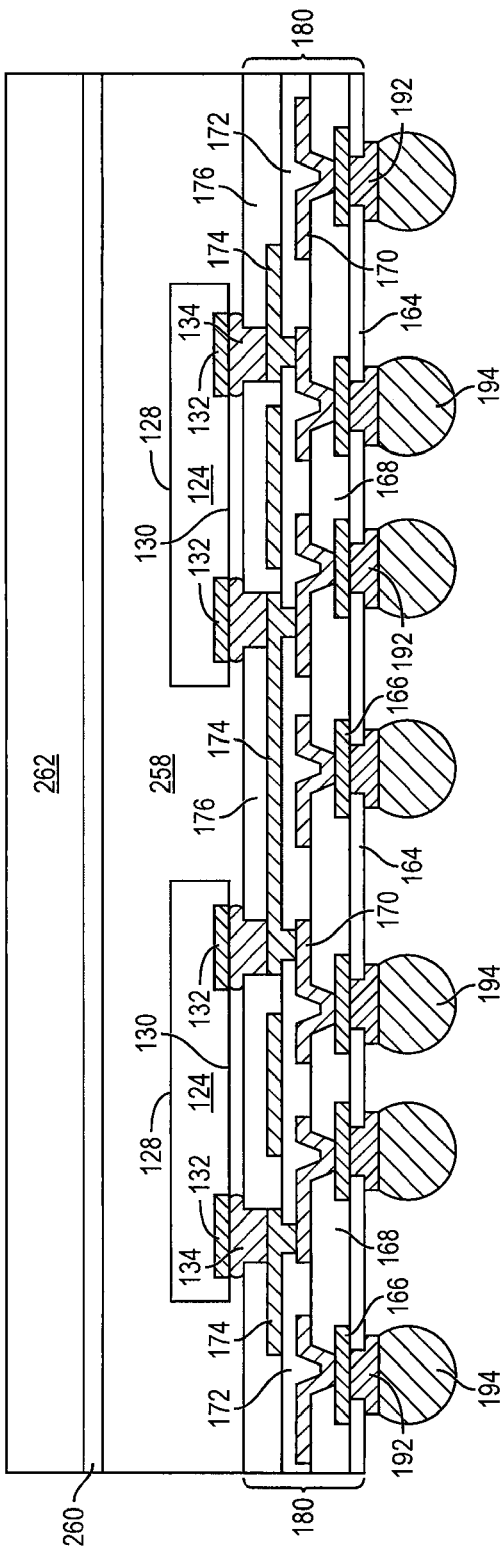
FIG. 9 illustrates an alternate embodiment of an interconnect structure for the semiconductor die with an adhesive and carrier over an encapsulant.

FIG. 9 illustrates an alternate embodiment of an interconnect structure for semiconductor die 124 with adhesive 260 and carrier 262 over encapsulant 258. In FIG. 9, WL RDL 180 is formed and semiconductor die 124 are mounted to WL RDL 180 as was described above with reference to FIGS. 5a-5e. An encapsulant or molding compound 258 can be formed over semiconductor die 124 and underlying WL RDL 180. An adhesive layer 260 can be applied to a top surface of encapsulant 258. A chip carrier 262 can be bonded to encapsulant 258 with adhesive layer 260. Chip carrier 262 can be metal, laminate substrate, glass, or polymer with filler. Chip carrier 262 can be pre-formed and then laminated or bonded to encapsulant 258. Chip carrier 262 can also be formed in-situ, for example, as a second molding compound or encapsulant. Adhesive layer 260 and chip carrier 262 can be temporary or permanent. A backside 128 of semiconductor die 124 can be exposed after molding, or thermally connected to carrier 262 for heat dissipation.

As was described above with reference to FIGS. 5f-5g, dummy substrate 162 can be removed by mechanical back grinding, chemical wet etching, plasma dry etching, or CMP. Insulating layer 164 can be patterned and etched to expose conductive layer 166. UBMs 192 are formed in electrical contact with conductive layer 166 and conductive layer 170. An electrically conductive solder material can be deposited over UBMs 192 using an electrolytic plating or electroless plating process.

An electrically conductive bump material is deposited over UBMs 192 using an evaporation, electrolytic plating, electroless plating, ball drop, or screen printing process. Bump material can be Al, Sn, Ni, Au, Ag, Pb, bismuth (Bi), Cu, solder, and combinations thereof, with an optional flux solution. For example, a bump material can be eutectic Sn/Pb, high-lead solder, or lead-free solder. A bump material is bonded to UBMs 192 using a suitable attachment or bonding process. In one embodiment, a bump material is reflowed by heating bump material above its melting point to form spherical balls or bumps 194. In some applications, bumps 194 are reflowed a second time to improve electrical contact to UBMs 192. Bumps 194 can also be compression bonded to UBMs 192. Bumps 194 represent one type of interconnect structure that can be formed over UBMs 192. An interconnect structure can also use bond wires, conductive paste, stud bump, micro bump, or other electrical interconnect.

Figure 10:
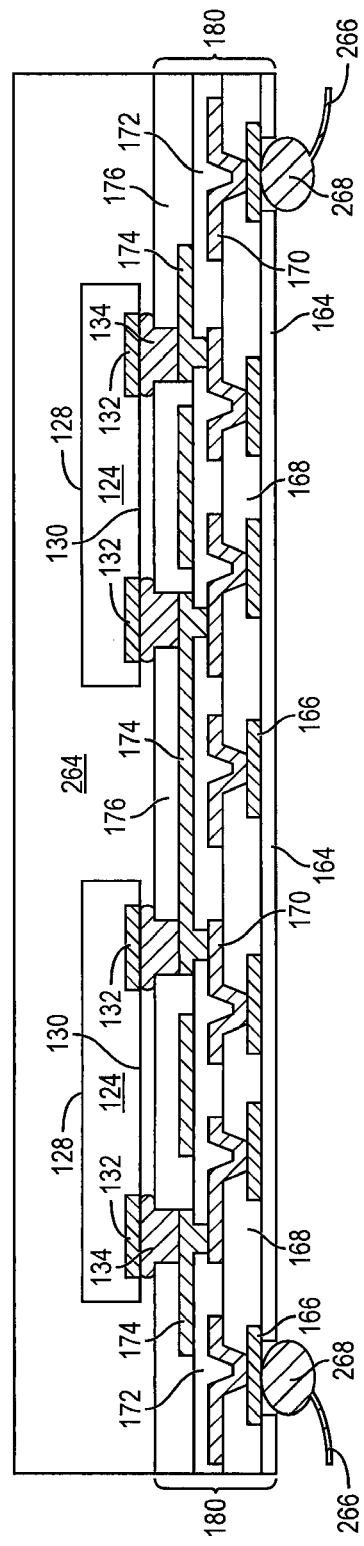
FIG. 10 illustrates an alternative embodiment of an interconnect structure for the semiconductor die with bond wires.

FIG. 10 illustrates an alternative embodiment of an interconnect structure for semiconductor die 124 with bond wires. In FIG. 10, WL RDL 180 is formed and semiconductor die 124 are mounted to WL RDL 180 as was described above with reference to FIGS. 5a-5e. An encapsulant or molding compound 264 can be formed over semiconductor die 124 and underlying WL RDL 180.

As was described above with reference to FIGS. 5f-5g, dummy substrate 162 can be removed by mechanical back grinding, chemical wet etching, plasma dry etching, or CMP. Insulating layer 164 can be patterned and etched to expose conductive layer 166. In this embodiment, after insulating layer 164 is patterned and etched to expose conductive layer 166, bond wires 266 are electrically connected to conductive layer 166 using wire bond 268.

FIG. 11 illustrates an alternative embodiment of an interconnect structure for semiconductor die 124 having first and second encapsulants. In FIG. 11, WL RDL 180 is formed and semiconductor die 124 are mounted to WL RDL 180 as was described above with reference to FIGS. 5a-5e. A first encapsulant or molding compound 270 can be formed over semiconductor die 124 and underlying WL RDL 180. Encapsulant 270 underfills semiconductor die 124. Next, encapsulant 270 can be planarized until backsides 128 of semiconductor die 124 are exposed.

A second encapsulant or molding compound 272 can be formed over encapsulant 270 and semiconductor die 124. Encapsulants 270, 272 can be made with epoxy or polymer material. Encapsulant 272 supports the semiconductor package and provides good thermal conductivity. Encapsulants 270, 272 can post-cure at the same time.

As was described above with reference to FIGS. 5f-5g, dummy substrate 162 can be removed by mechanical back grinding, chemical wet etching, plasma dry etching, or CMP. Insulating layer 164 is patterned and etched to expose conductive layer 166. UBMs 192 are formed in electrical contact with conductive layer 166 and conductive layer 170.

An electrically conductive bump material is deposited over UBMs 192 using an evaporation, electrolytic plating, electroless plating, ball drop, or screen printing process. Bump material can be Al, Sn, Ni, Au, Ag, Pb, bismuth (Bi), Cu, solder, and combinations thereof, with an optional flux solution. For example, bump material can be eutectic Sn/Pb, high-lead solder, or lead-free solder. Bump material is bonded to UBMs 192 using a suitable attachment or bonding process. In one embodiment, bump material is reflowed by heating bump material above its melting point to form spherical balls or bumps 194. In some applications, bumps 194 are reflowed a second time to improve electrical contact to UBMs 192. Bumps 194 can also be compression bonded to UBMs 192. Bumps 194 represent one type of interconnect structure that can be formed over UBMs 192. An interconnect structure can also use bond wires, conductive paste, stud bump, micro bump, or other electrical interconnect.

In summary, wafer level interconnect structures, such as WL RDL 180 (FIGS. 5a-5g, 7-11) or WL RDL 212 (FIGS. 6a-6g) can be formed on a dummy substrate prior to mounting semiconductor die to WL interconnect structures. Once semiconductor die are mounted and encapsulated, dummy substrates can be removed so external interconnects (e.g., UBMs 192 and conductive bumps 194) can be formed. By forming WL interconnect structures on a dummy substrate prior to mounting semiconductor die to WL interconnect structures, a processing temperature restriction due to a conventional WL process noted in the background section can be reduced. In other words, since there is no substrate with Tg less than 200° C. used in the process, higher temperatures equal to or greater than 200° C. can be used to form WL interconnect structures.

Figure 12D:
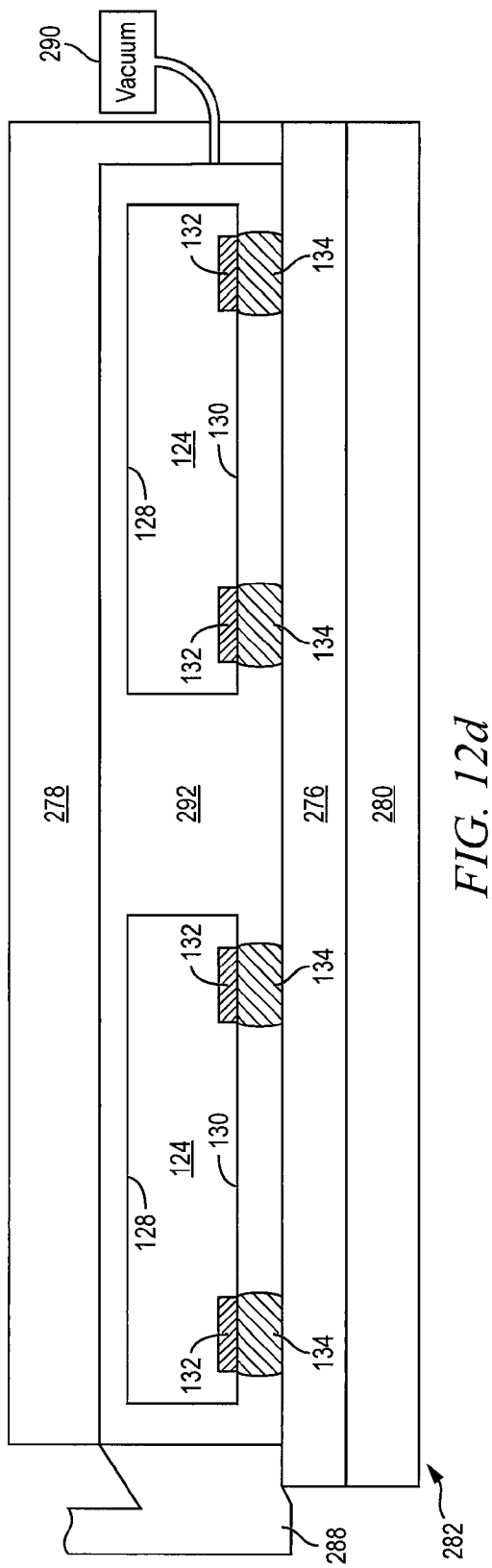

FIGS. 12a-12d are illustrative of mold underfill (MUF) processes that are useful for depositing encapsulant around semiconductor die 124 and in a gap between semiconductor die and an underlying substrate 276 or other structure after semiconductor die 124 have been mounted to underlying substrate 276. In FIG. 12a, semiconductor die 124 have contact pads 132 formed on an active surfaces 130, and bumps 134 formed on contact pads 132. Semiconductor die 124 are flip chip mounted to substrate 276 with conductive bumps 134, which electrically and mechanically connects semiconductor die 124 to substrate 276. Semiconductor die 124 and substrate 276 are placed between upper mold support 278 and lower mold support 280 of chase mold 282. Other semiconductor die and substrate or wafer level interconnect combinations, such as those illustrated in FIGS. 5a-5g, 6a-6g, 7, and 9-11, can also be placed between upper mold support 278 and lower mold support 280 of chase mold 282. Upper mold support 278 includes compressible releasing film 284.

In FIG. 12b, upper mold support 278 and lower mold support 280 are brought together to enclose semiconductor die 124 and substrate 276 with an open space over substrate 276 and between semiconductor die 124 and substrate 276. Compressible releasing film 284 conforms to back surface 128 and side surfaces of semiconductor die 124 to block formation of encapsulant on these surfaces. An encapsulant 286 in a liquid state is injected into one side of chase mold 282 with nozzle 288 while an optional vacuum assist 290 draws pressure from an opposite side of chase mold 282 to uniformly fill open space over substrate 276 and between semiconductor die 124 and substrate 276 with encapsulant 286, as illustrated in FIG. 12c.

Encapsulant 286 can be polymer composite material, such as epoxy resin with filler, epoxy acrylate with filler, or polymer with proper filler. Encapsulant 286 is non-conductive and environmentally protects a semiconductor device from external elements and contaminants. Compressible material 284 prevents encapsulant 286 from flowing over back surfaces 128 and around side surfaces of semiconductor die 124. Encapsulant 286 is cured. Back surfaces 128 and side surfaces of semiconductor die 124 remain exposed from encapsulant 286.

FIG. 12d shows an embodiment of MUF and mold overfill (MOF) without compressible material 284. Semiconductor die 124 and substrate 276 are placed between upper mold support 278 and lower mold support 280 of chase mold 282. Upper mold support 278 and lower mold support 280 are brought together to enclose semiconductor die 124 and substrate 276 with an open space over substrate 276, around semiconductor die 124, and between semiconductor die 124 and substrate 276. Encapsulant 292 in a liquid state is injected into one side of chase mold 282 with nozzle 288 while an optional vacuum assist 290 draws pressure from an opposite side of chase mold 282 to uniformly fill open space around semiconductor die 124, over substrate 276, and between semiconductor die 124 and substrate 276 with encapsulant 292. Encapsulant 292 is then cured.

In another embodiment, nozzle 288 can be placed in a central region of a chase mold or strip of die so that encapsulant flows outward towards edges of semiconductor die 124 and substrate 276.

Figure 13:
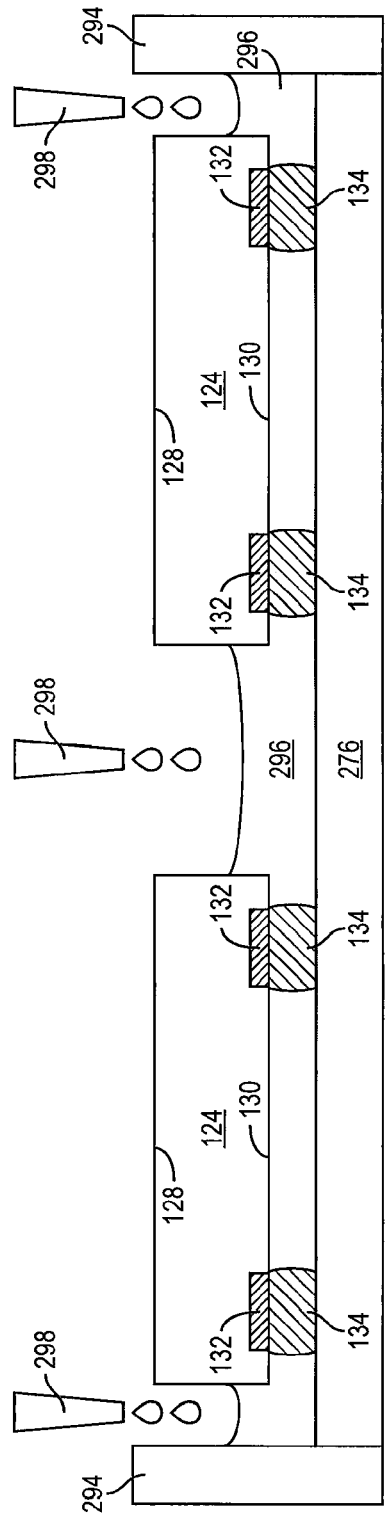
FIG. 13 is illustrative of another process that is useful for depositing encapsulant around semiconductor die and in a gap between semiconductor die and an underlying substrate after semiconductor die are mounted to the underlying substrate.

FIG. 13 is illustrative of another process that is useful for depositing encapsulant around semiconductor die 124 and in a gap between semiconductor die and an underlying substrate 276 after semiconductor die 124 have been mounted to underlying substrate 276. Semiconductor die 124 and substrate 276 are enclosed by a dam 294. Encapsulant 296 is dispensed from nozzles 298 in a liquid state into dam 294 to fill open space over substrate 276 and between semiconductor die 124 and substrate 276. A volume of encapsulant 296 that is dispensed from nozzles 298 can be controlled to fill dam 294 without covering back surfaces 128 or side surfaces of semiconductor die 124. Encapsulant 296 is then cured.

While one or more embodiments of the present invention have been illustrated in detail, a skilled artisan will appreciate that modifications and adaptations to those embodiments may be made without departing from the scope of the present invention as set forth in the following claims.

What is claimed:

1. A method of making a semiconductor device, comprising:
 providing a silicon substrate capable of sustaining temperatures equal to or greater than 200° C.;
 forming an interconnect structure over the silicon substrate at temperatures equal to or greater than 200° C. by,
   (a) forming a multi-layer under bump metallization (UBM) comprising a wetting layer in contact with a surface of the silicon substrate and an adhesion layer formed over the wetting layer,
   (b) forming an insulating layer over the multi-layer UBM and substrate, and
   (c) forming a conductive layer over the insulating layer;
 disposing a semiconductor die over the interconnect structure;

depositing a first encapsulant over the semiconductor die with the first encapsulant disposed over a surface of the semiconductor die opposite the interconnect structure and between the semiconductor die and interconnect structure;
removing a portion of the first encapsulant to planarize the first encapsulant with the surface of the semiconductor die;
depositing a second encapsulant over semiconductor die and first encapsulant;
removing the silicon substrate from over the wetting layer of the multi-layer UBM and insulating layer after disposing the semiconductor die over the interconnect structure; and
forming a plurality of first conductive bumps contacting the wetting layer of the multi-layer UBM.

2. The method of claim 1, wherein disposing the semiconductor die over the interconnect structure includes:
forming a plurality of second conductive bumps over the semiconductor die; and
bonding the second conductive bumps of the semiconductor die to the interconnect structure.

3. The method of claim 2, wherein the second conductive bumps include micro bumps.

4. The method of claim 1, wherein the conductive layer follows a contour of the insulating layer.

5. The method of claim 1, wherein forming the multi-layer UBM further includes:
forming a barrier layer over the wetting layer; and
forming the adhesion layer over the barrier layer.

6. A method of making a semiconductor device, comprising:
providing a substrate including a semiconductor material capable of sustaining temperatures equal to or greater than 200° C.;
forming a wafer level interconnect structure over the substrate at temperatures equal to or greater than 200° C. by,
(a) forming a multi-layer under bump metallization (UBM) in contact with a surface of the substrate, and
(b) forming an insulating layer over the multi-layer UBM;
disposing a plurality of semiconductor die over the wafer level interconnect structure after forming the wafer level interconnect structure at temperatures equal to or greater than 200° C.;
depositing a continuous flow of a first encapsulant over a surface of the semiconductor die and across an entire surface of the wafer level interconnect structure and between the semiconductor die and wafer level interconnect structure;
removing the substrate from over a surface of the multi-layer UBM opposite the semiconductor die after disposing the semiconductor die over the wafer level interconnect structure; and
forming a bump material contacting the surface of the multi-layer UBM.

7. The method of claim 6, wherein depositing the first encapsulant includes injecting the first encapsulant into a chase mold.

8. The method of claim 6, further including drawing the first encapsulant between the semiconductor die and wafer level interconnect structure with a vacuum assist.

9. The method of claim 6, further including curing the insulating layer at a temperature greater than or equal to 200° C.

10. A method of making a semiconductor device, comprising:
providing a substrate including an insulating material or semiconductor material and capable of sustaining temperatures equal to or greater than 200° C.;
forming a wafer level interconnect structure over the substrate at temperatures equal to or greater than 200° C. by,
(a) forming a first insulating layer on a surface of the substrate, and
(b) forming a conductive layer over the first insulating layer;
disposing a plurality of semiconductor die over the wafer level interconnect structure after forming the wafer level interconnect structure at temperatures equal to or greater than 200° C.;
depositing a continuous flow of a first encapsulant over the semiconductor die and across an entire surface of the wafer level interconnect structure and between the semiconductor die and wafer level interconnect structure; and
forming a plurality of openings in the first insulating layer over a surface of the conductive layer after depositing the first encapsulant.

11. The method of claim 10, further including forming a plurality of bumps over the semiconductor die.

12. A method of making a semiconductor device, comprising:
providing a substrate capable of sustaining temperatures equal to or greater than 200° C.;
forming a wafer level interconnect structure on the substrate at temperatures equal to or greater than 200° C. by,
(a) forming an insulating layer on the substrate, and
(b) forming a conductive layer over the insulating layer;
disposing a plurality of semiconductor die over the wafer level interconnect structure after forming the wafer level interconnect structure at temperatures equal to or greater than 200° C.;
depositing a continuous flow of a first encapsulant across an entire surface of the wafer level interconnect structure and between the semiconductor die and wafer level interconnect structure; and
forming an opening in the insulating layer over a surface of the conductive layer.

13. The method of claim 12, further including injecting the first encapsulant into a mold.

14. The method of claim 12, further including drawing the first encapsulant across the wafer level interconnect structure with a vacuum assist.

15. The method of claim 12, further including forming a multi-layer under bump metallization (UBM) over the conductive layer.

16. The method of claim 12, further including:
removing the substrate; and
forming a second interconnect structure over the conductive layer.

17. The method of claim 12, further including depositing a second encapsulant over the first encapsulant.

18. The method of claim 1, further including simultaneously curing the second encapsulant and first encapsulant.

19. The method of claim 6, further including depositing a second encapsulant over the first encapsulant.

20. The method of claim 6, wherein forming the multi-layer UBM includes:
forming a wetting layer over the substrate;

forming a barrier layer over the wetting layer; and
forming an adhesion layer over the barrier layer.

21. The method of claim 10, further including:
   forming a multi-layer under bump metallization (UBM) over the surface of the conductive layer; and
   depositing a second insulating layer over the first insulating layer and multi-layer UBM.

22. The method of claim 10, further including:
   removing the substrate; and
   forming a second interconnect structure over the wafer level interconnect structure opposite the semiconductor die.

23. The method of claim 10, further including depositing a second encapsulant over the first encapsulant.

24. The method of claim 10, further including:
   forming a second insulating over the first insulating layer opposite the conductive layer; and
   forming a plurality of second interconnect structures over the surface of the conductive layer.

25. The method of claim 10, further including:
   disposing a carrier on a surface of the first encapsulant opposite the wafer level interconnect structure; and
   forming a plurality of second interconnect structures in the openings in the first insulating layer.

26. The method of claim 12, wherein the substrate includes silicon.

* * * * *